(12) United States Patent
Miller

(10) Patent No.: US 7,516,030 B2
(45) Date of Patent: Apr. 7, 2009

(54) MEASURING COMPONENTS OF JITTER

(75) Inventor: Martin Thomas Miller, Avusy (CH)

(73) Assignee: LeCroy Corporation, Chestnut Ridge, NY (US)

( * ) Notice: Subject to any disclaimer, the term of this patent is extended or adjusted under 35 U.S.C. 154(b) by 136 days.

(21) Appl. No.: 11/362,499

(22) Filed: Feb. 24, 2006

(65) Prior Publication Data

US 2006/0251200 A1 Nov. 9, 2006

Related U.S. Application Data

(60) Provisional application No. 60/727,695, filed on Oct. 18, 2005, provisional application No. 60/656,478, filed on Feb. 25, 2005, provisional application No. 60/656,218, filed on Feb. 25, 2005.

(51) Int. Cl.
  *G01R 13/00* (2006.01)
(52) U.S. Cl. .................... 702/69; 702/79; 375/226; 375/371
(58) Field of Classification Search ........... None
  See application file for complete search history.

(56) References Cited

U.S. PATENT DOCUMENTS

| | | | | |
|---|---|---|---|---|
| 4,827,431 | A * | 5/1989 | Goldshtein | 375/226 |
| 5,012,494 | A * | 4/1991 | Lai et al. | 375/376 |
| 6,614,434 | B1 * | 9/2003 | Finke | 345/440 |
| 2002/0004920 | A1 * | 1/2002 | Cho et al. | 714/704 |
| 2002/0176525 | A1 * | 11/2002 | Yamaguchi et al. | 375/371 |
| 2005/0080574 | A1 * | 4/2005 | Draving | 702/69 |
| 2006/0059392 | A1 * | 3/2006 | Kizer et al. | 714/704 |

OTHER PUBLICATIONS

"The Difference Between Edge-To-Reference and Edge-To-Edge "Jitter" Analysis," LeCroy Technical Brief by Dr. Martin Miller, Jan. 27, 2005, pp. 1-4.
"Comparison of DCD+ISI Measurements For SDA, Wavecrest SIA3000 and a Sampling Oscilloscope," LeCroy Technical Brief by Dr. James Mueller and Dr. Martin Miller, Jan. 27, 2005, pp. 1-5.
"Bridging the Gap Between BER and Eye Diagrams—A BER Contour Tutorial," BERTScope, The Logical Evolution of Test by Guy Foster, SyntheSys Research, Inc., Oct. 2005, pp. 1-9.

(Continued)

*Primary Examiner*—Manuel L Barbee
(74) *Attorney, Agent, or Firm*—Fish & Richardson P.C.

(57) ABSTRACT

Apparatus and associated systems, methods and computer program products relate to isolating horizontal jitter component(s) from vertical jitter component(s). In preferred embodiments, at least one horizontal component of jitter is distinguished from at least one component of vertical jitter by fitting a curve to a digitally acquired waveform, determining the curve slope and statistical variance about the fitted curve over at least one time period, identifying a functional relationship between the variance and slope, and determining therefrom at least one horizontal component of jitter and at least one vertical component of jitter. Random and deterministic jitter components may be aggregated, in certain embodiments, so as to identify a vertical jitter component that reflects both deterministic and random jitter. In preferred implementations, the isolated vertical jitter component is subtracted from a total jitter measurement so as to better approximate actual signal jitter.

40 Claims, 20 Drawing Sheets

OTHER PUBLICATIONS

"Jitter Analysis: The dual-Dirac Model, RJ/DJ, and Q-Scale," Agilent Technologies, Dec. 2004, pp. 1-16.

"Random Noise Contribution to Timing Jitter—Theory and Practice," Maxim, Dallas Semiconductor, Sep. 2005, 14 pgs.

"A Simple Method For Estimation of True Jitter For Period, Skew, Half-Period and Cycle-Cycle Jitter," LeCroy Technical Brief by Dr. Martin Miller, Jan. 18, 2005, pp. 1-2.

"Understanding and Characterizing Timing Jitter," Tektronix, pp. 1-24.

"Jitter Fundamentals—The Reference Standard For Signal Integrity Analysis," Wavecrest, pp. 1-16.

"Jitter Analysis Solutions Home In On Noise And Its Impact," Design & Manufacturing Newsletter Article, Aug. 2005, pp. 1-5.

"Delta Function." From MathWorld—A Wolfram Web Resource. Eric W. Weisstein http://mathworld.wolfram.com/DeltaFunction.html.

Error Function and Fresnel Integrals (Mathematical properties), "Handbook of Mathematical Functions with Formulas, Graphs, and Mathematical Tables," edited by Milton Abramowitz and Irene A. Stegun, National Bureau of Standards, Issued Jun. 1964, Tenth printing, Dec. 1972, with corrections, pp. 297-309.

"Precision Jitter Analysis Using the Agilent 86100C DCA-J, Agilent product note 86100C-1" Agilent Technologies, Jun. 16, 2004, pp. 1-28.

"Random Pattern Testability," J. Savir, G.S. Ditlow, and P.H. Bardell, IEEE Trans. Computers, Jan. 1984, pp. 79-90.

"Fibre Channel—Methodologies for Jitter and Signal Quality Specification (FC-MJSQ)," T11.2 project 1316-DT Rev. 14, Jun. 19, 2004, 263 pages.

International Search Report mailed Oct. 18, 2007 in PCT/US2006/006590, 13 pages.

"Understanding and Characterizing Timing Jitter," Tektronix, pp. 1-24, 2003.

"Delta Function." From MathWorld—A Wolfram Web Resource. Eric W. Weisstein http://mathworld.wolfram.com/DeltaFunction.html, 1999.

"An Algorithm For Computing The Inverse Normal Cumulative Distribution Function," most recently modified Mar. 13, 2005 by Peter J. Acklam (pjacklam@online.no).

LeCroy Technical Brief: Transition Density: what does it affect and why is it explicitly specified within the LeCroy SDA?, M. T. Miller, Jan. 27, 2005 http://www.lecroy.com/tm/Library/WhitePapers/PDF/WP_TechBrief_Trans_Den.pdf.

"Advanced Jitter, Noise and BER Analysis Software for TDS/CSA8000 Series Sampling Oscilloscopes," Tektronix article updated Jun. 15, 2005 (2 pgs).

"Tektronix Introduces Sampling Oscilloscope Software Providing Ultimate Validation and Conformance Test Capabilities for High Speed Serial Data Signals," www.tek.com, Aug. 2005.

"Impact of Noise on BER Estimation," by Michael Nelson and Pavel Zivny, Tektronix, Aug. 2005.

* cited by examiner $0 \leq \varphi < 2\pi$

US 7,516,030 B2

MEASURING COMPONENTS OF JITTER

CROSS REFERENCE TO RELATED APPLICATIONS

This application claims priority under 35 USC §19(e) to: U.S. patent application Ser. No. 60/656,478, entitled "Separation of Vertical and Horizontal Noise Using Periodic Fit Residuals," which was filed by Miller on 25 Feb. 2005 and is incorporated herein by reference; U.S. patent application Ser. No. 60/656,218, entitled "Resolution of Vertical Noise and Horizontal Noise Contributions from CIS Acquisition on Serial Data Patterns," which was filed by Miller et al. on 25 Feb. 2005 and is incorporated herein by reference; and, U.S. patent application Ser. No. 60/727,695, entitled "Jitter Measurement Method and Apparatus," which was filed by Miller on 18 Oct. 2005.

TECHNICAL FIELD

Various embodiments relate generally to jitter or noise measurement. Preferred embodiments relate to methods and systems for resolving jitter and/or noise into horizontal and/or vertical components.

BACKGROUND

Data rates continue to increase in digital systems, communication systems, computer systems, and in other applications. In such applications, various devices communicate data using signals that are encoded with information in the form of signal levels (e.g., amplitude) in certain intervals of time. Proper decoding of periodic signals, for example, involves measuring the signal level in the correct time interval, or period. As data rates increase, margins of error in the signal level timing tend to decrease.

In general, errors in which signal event deviates in its timing from an ideal timing is sometimes referred to as "jitter."

Jitter may be introduced to a signal from a variety of sources. For example, jitter may be added to a signal by circuit elements used to generate, convey, and/or receive the signal. To various degrees, circuit elements may add jitter to the signal through cross-talk, reflections, shot noise, flicker noise, and/or thermal noise. Electromagnetic interference (EMI) may also contribute to jitter.

Typically, jitter is measured as a total jitter. Total jitter may represent a convolution of all independent jitter components, which include contributions from deterministic and random components. Random jitter, such as that caused by noise, typically exhibits a Gaussian distribution. Deterministic jitter may include periodic jitter, duty cycle distortion, and intersymbol interference.

Jitter measurements may be made in a variety of applications, examples of which may include Fibre Channel, Gigabit Ethernet, XAUI, InfiniBand, SONET, Serial ATA, 3GIO, and Firewire. To illustrate the importance of jitter in such applications, a nanosecond of jitter in a 100baseT (100 Mb/s) device may represent a 10% data uncertainty. For example, the same nanosecond of jitter may represent a 20% data uncertainty if the data rate is increased to 200 Mb/s, or a 100% data uncertainty in a Gigabit Ethernet device.

SUMMARY

Apparatus and associated systems, methods and computer program products relate to isolating horizontal jitter component(s) from vertical jitter component(s). In preferred embodiments, at least one horizontal component of jitter is distinguished from at least one component of vertical jitter by fitting a curve to a digitally acquired waveform, determining the curve slope and statistical variance about the fitted curve over at least one time period, identifying a functional relationship between the variance and slope, and determining therefrom at least one horizontal component of jitter and at least one vertical component of jitter. Random and deterministic jitter components may be aggregated, in certain embodiments, so as to identify a vertical jitter component that reflects both deterministic and random jitter. In preferred implementations, the isolated vertical jitter component is subtracted from a total jitter measurement so as to better approximate actual signal jitter.

Certain embodiments may provide one or more of the following advantages. First, resolving measured jitter into horizontal and/or vertical components may provide valuable insight into sources of jitter in a system, and may yield quantitative estimates for the horizontal and/or vertical jitter components. For instance, some embodiments may estimate signal jitter after separating out jitter added by the measurement instrument (which is some cases corresponds to the vertical jitter component). As another example, jitter measurements may be refined into orthogonal components that are physically meaningful. Such information may be used to locate and/or quantify sources of jitter. System designers or maintainers may use estimates of the components of jitter to evaluate and/or develop mitigation strategies, improvements, or corrections of signal integrity issues such as high bit error rates, that may be due, at least in part, to jitter. As such, systems may be optimized to communicate more efficiently (e.g., fewer re-tries), at higher data rates, and/or at reduced bit error rates. In addition, some embodiments may improve jitter measurements without prior knowledge of bit pattern or pattern length, and/or without a synchronization input signal.

The details of one or more embodiments of the invention are set forth in the accompanying drawings and the description below. Other features, objects, and advantages of the invention will be apparent from the description and drawings, and from the claims.

DESCRIPTION OF DRAWINGS

This document describes these and other aspects in detail with reference to the following drawings.

Like reference symbols in the various drawings indicate like elements.

DETAILED DESCRIPTION OF PREFERRED EMBODIMENTS

Figure 1:
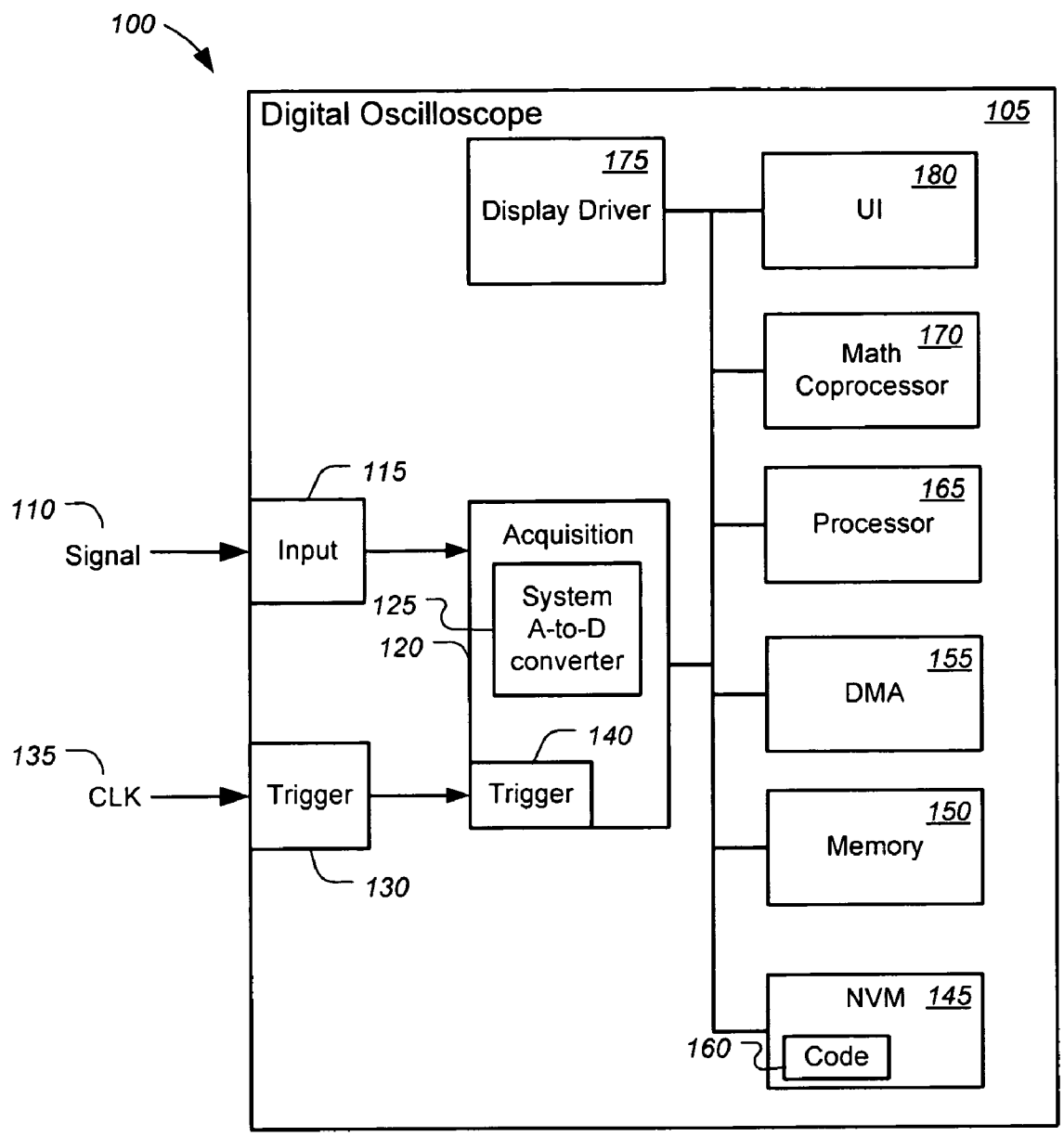
FIG. 1 is an exemplary signal measurement system that can measure vertical and horizontal jitter in a signal under test.

In an exemplary embodiment, FIG. 1 shows a signal measurement system 100 with extended jitter analysis capabilities that include resolving total jitter into its horizontal jitter and vertical jitter components. The system 100 includes a digital oscilloscope (DO) 105 capable of measuring total jitter of an input signal 110.

Sometimes the term "jitter" is used to refer to phase or time domain error (such as that caused by an oscillator that does not hold a fixed frequency) in contrast to "noise," a term which is sometimes used to refer to amplitude error (such as that caused by voltage spikes induced by electromagnetic interference). Alternatively, the term "jitter" may be viewed as including "vertical jitter" that corresponds to amplitude error and "horizontal jitter" that corresponds to time domain error. In this conceptualization of jitter, vertical jitter sometimes corresponds to noise effects and horizontal jitter is sometimes referred to as "true jitter" or "time domain jitter." As used herein, the term "jitter" is used in the latter sense.

In the system 100, the DO 105 is modified to perform operations to resolve a measured total jitter of the input signal 110 into an estimated horizontal jitter and an estimated vertical jitter. An operator, such as a communication engineer, a digital signal processing (DSP) engineer, or a network designer, may use the signal measurement system 100 to estimate timing and amplitude jitter in a wired, wireless, fiber optic, or hybrid communication system. By resolving the jitter into temporal and amplitude components, the operator may be better able to optimize signal transmission performance and/or signal integrity in the communication system.

As an example, the system 100 may quantify a horizontal jitter ($J_H$) component and/or a vertical jitter ($J_V$) component present in the input signal 110. In some applications, the system 100 may be used to estimate a horizontal signal jitter ($J_{SH}$) and/or a vertical signal jitter ($J_{SV}$) in the input signal 110. In some further applications, the system may be used to estimate a horizontal intrinsic jitter ($J_{IH}$) and/or a vertical intrinsic jitter ($J_{IV}$) added to input signals by the DO 105. In some embodiments, the system 100 may use predetermined information about the horizontal and/or vertical jitter introduced by the DO 105 to generate improved estimates of $J_{SV}$ and $J_{SH}$.

In various embodiments, the digital oscilloscope 105 may be a real-time oscilloscope, an equivalent time (ET) oscilloscope, or a near real-time oscilloscope (NRO) that uses coherent interleaved sampling (CIS). An example of a NRO is a WaveExpert 9000 SDA100G oscilloscope manufactured by LeCroy Corporation in Chestnut Ridge, N.Y. Various embodiments may be adapted from digital storage oscilloscopes, digital sampling oscilloscopes, or other signal measurement systems, such as data acquisition equipment.

Some embodiments may provide an input waveform digitizing system to provide waveform data to a processing system configured to determine horizontal and vertical components of jitter as described elsewhere herein. For example, an optical waveform may be acquired for analysis of its horizontal and/or vertical jitter components by converting the optical signal to an electrical signal using an electro-optical converter, and then digitized, for example, by one or more analog-to-digital converters. In some embodiments, the system may be provided in a digital oscilloscope.

In some embodiments, the system 100 can analyze jitter in the input signal 110 that is either repetitive or non-repetitive. The input signal 110 may be a radio frequency (RF) signal, an optical signal, a serial data signal, a multilevel data signal etc. For example, the input signal 110 under measurement may have characteristics of a clock signal, a periodic signal, a serial data with return to zero (RZ) data pattern, or a serial data with non-return to zero (NRZ) data pattern. In some embodiments, a curve may be fit to a periodic signal such as a clock signal.

As an example, the system 100 can generate an estimate of horizontal and/or vertical jitter in the input signal 110 by resolving the measured total jitter into $J_H$ and the $J_V$ components. The system 100 can generate an estimate of total jitter in the input signal 110 by reducing contribution of the intrinsic jitter introduced by the signal measurement system 100 in the estimated total jitter. In various examples, the system may be used to quantify horizontal jitter and vertical jitter present in a signal and/or in an observed measurement. As budgets for jitter are reduced in some applications, quantitative analysis of the horizontal and vertical jitter may provide valuable insight to improve designs or assess system performance, for example.

A serial data communication engineer, RF communication engineer, or a digital hardware engineer, for example, may use the horizontal or vertical jitter component information to design, analyze, test, and/or maintain, for example, a communication system with high bit rate, such as five gigabits per second (Gb/s) or above. For example, relative or absolute information about horizontal and/or vertical jitter may be applied by an engineer to, e.g., adjust filtering, locate impedance changes in the communication link, adjust source amplitude, adjust source/sink impedance, termination, oscillator stability, EMI (e.g., shielding, better cables). To control amplitude and/or timing jitter, an engineer may adjust edge slew rates, for example, to reduce the contribution of vertical noise on subsequent stages. In some cases, the engineer may select different components, supply voltages, and/or technologies (e.g., ECL, TTL, CMOS). For some clocks, a resonance characteristic (e.g., quality factor, Q) may be adjusted.

In this example, the input signal 110 is received by the DO 105 through an input interface 115, and then the signal 110 passes to an acquisition module 120 for processing. The input interface 115 may include, for example, a connector, antenna, or detector (e.g., photo receiver) suitable to receive the input signal 110. In some applications, the signal 110 may be sensed by an active or passive probe coupled to a transmission line, air link, or other transmission channel or medium. The signal may be sensed, transported, and/or received using, for example, coaxial cable, microstrip, coplanar waveguides, waveguides, ribbon cable, shielded or unshielded twisted pair, optical fiber, antenna, printed circuits, or a combination of any of these or other similar apparatus. In various applications, the input signal 110 may be originated from a signal generator, analog and/or digital circuitry, transceivers (e.g., modem), wired or wireless or fiber optic communications equipment, or other apparatus for which signal jitter measurement and analysis may be of interest.

In some applications, jitter analysis may be performed at the design phase, or during design qualification testing. Jitter analysis may also be performed to test the interoperability of equipment, such as equipment from different manufacturers that operate together in a system, such as a telecommunication system, for example.

After passing through the input interface 115, the input signal 110 is received by the acquisition module 120. In this example, the acquisition module 120 may sample the input signal 110 for subsequent processing. In some embodiments, more than one period of a periodic input signal (e.g., a repetitive digital signal sequence) may be sampled. For example, the acquisition module 120 may take numerous samples of each bit in a 64 bit long repeating pattern, and repeatedly acquire samples from the 64 bit pattern for several thousand cycles of the pattern. The acquisition module 120 may acquire any practical number of samples for each bit, any pattern length, or cycles of the repeating pattern, subject to considerations such as effective sample rate, memory size, processing speed, system bandwidth, and/or accuracy specifications for example.

The acquisition module 120 includes an Analog-to-Digital converter (ADC) 125 to convert the analog input signal 110 into digital samples for processing and storage. For example, the ADC 125 may digitize the amplitude of the input signal 110 over a sequence of sample periods.

The system 100 further includes a trigger interface 130 that is coupled to receive a clock input (CLK) signal 135. In some embodiments, the CLK signal 135 may provide synchronization information for the input signal 110 to a trigger module 140 in the acquisition module 120. The trigger interface 130 may include, for example, an interface according to examples described with reference to the input 115. The CLK signal 135 may originate, for example, from a clock or other signal synchronized to the input signal 110.

In some embodiments, the system 100 may resolve jitter in the input signal 110 based on the CLK signal 135. In particular embodiments, the trigger module 140 may determine when to initiate sampling based on the CLK signal 135. For example, when using positive edge triggering and ET (equivalent time) acquisition sampling, the acquisition module 120 may trigger sampling when, during a positive edge transition, the CLK signal 135 reaches a user-specified threshold voltage.

In other embodiments, the system 100 may resolve jitter in the input signal 110 without receiving or using the CLK signal 135. In particular embodiments, the system 100 may use a sampling method that does not require external or hardware pattern recognition or synchronization. For example, in CIS (coherent interleaved sampling), the trigger module 140 may determine when to initiate sampling without reference to the CLK signal 135. In other examples, the trigger module 140 may initiate sampling once at the start of an acquisition of multiple periods of the input signal 110.

In various embodiments, jitter components of the input signal 100 may be analyzed without using any information extrinsic to the signal itself about the frequency, duty cycle, and/or period of the input signal 110. Some embodiments may process the input signal 100 without receiving information extrinsic to the signal itself about the signal pattern and/or pattern length. In some embodiments, the system 100 may resolve components of jitter without receiving information extrinsic to the signal itself about the encoding and/or encryption of the input signal 110. These and other examples are described in further detail with reference to FIG. 3.

The system 100 of this example also includes a processor 165 and a math coprocessor 170. The processor 165 and/or coprocessor 170 may perform various functions, such as supervisory, user interface, signal processing, and signal analysis, in support of the measurement system 100 operations. For example, the processor 165 may supervise various operations, such as waveform data collection and user interaction. The math coprocessor 170 may include one or more of the following: an ASIC (application specific integrated circuit), DSP (digital signal processor), discrete or integrated analog and/or digital circuits, and a dedicated digital logic architecture to perform mathematics functions, for example. The math coprocessor 170 may cooperate with the processor 165 to perform various functions. For example, the math coprocessor 170 may perform operations that include floating point arithmetic, signal processing, digital filtering (e.g., IIR, FIR) and/or numerical operations (e.g., curve fitting, numerical derivative computation, numerical integration, fast Fourier transformation (FFT), and interpolation). In various embodiments, the processors 165, 170 may cooperate to perform statistical analysis, such as computing the variance ($\sigma$) of a set of samples. Examples of some mathematical operations used to resolve horizontal and vertical components of jitter are described in further detail with reference to FIGS. 5-6C.

In this example, the processor 165 is coupled through a digital bus to memory devices, including a non-volatile memory (NVM) 145, a memory 150, and a Direct Memory Access (DMA) controller 155. The NVM 145 may provide a storage space for storing data (e.g., sampled waveform data acquired by the acquisition module 120) and/or executable instructions (e.g., application software). NVM 120 may include, for example, flash memory, read only memory (ROM), EEPROM, data storage devices with rotating media (e.g., optical or magnetic disc drive), tape storage devices, or any combination of such devices. The memory 150 may provide temporary storage for the sampled signal data from the acquisition module 120. The memory 150 may be, for example, RAM, a buffer, or cache memory, which may provide volatile data storage. In some embodiments, the processors 165, 170 may quickly access the memory 150 to retrieve and store data. In some embodiments, the memory 150 may also store intermediate results produced by the processor 165 and/or math coprocessor 170. For example, the memory 150 may store the data for an eye diagram generated for a repetitive bit pattern, and store a corresponding persistence map that provides data for each bit interval in the pattern. The DMA 155 may handle accesses of the memory 150 without direct involvement of the processors 165, 170. For example, the DMA 155 can move data from one memory location to another memory location. In another example, the DMA 155 may be configured to move samples of the sampled input signal 110 from the acquisition module 120 directly into sequential memory locations, such as an array in the memory 150 and/or the NVM 145, for subsequent jitter analysis. In yet another example, the acquired waveform data may be sent directly to a buffer or a cache that is quickly accessible to at least one of the processors 165, 170.

Data caching and/or streaming may be used to improve processing efficiency by, for example, reducing calculation time. In some embodiments, waveform, statistical analysis, and/or other processing operations performed by the system 100 may use caching and/or data streaming techniques to improve data processing efficiency. In certain embodiments, streaming architectures may be used to facilitate data processing operations that may be performed according to jitter analysis methods described herein. Suitable streaming architectures and associated methods that may be used in conjunction with the methods described herein include embodiments that are described in U.S. Pat. No. 6,539,318, which issued to Miller et al. on Mar. 25, 2003, and which is assigned to the assignee of the present application. The present application incorporates the Detailed Description and the Figures of U.S. Pat. No. 6,539,318 herein by reference.

In this example, the NVM 145 is coupled to the processor 165 by a digital address/data bus. The processor 165 may execute instructions and retrieve information stored in the NVM 145 via the bus. The NVM 145 includes a code module 160 containing instructions that, when executed by the processor 165 and/or math coprocessor 170, may cause the processor to perform operations to resolve a measured total jitter into its horizontal and vertical components. The NVM 145 may include a number of other code modules (not shown) to perform other operations, including operations in support of basic digital oscilloscope operations (e.g., user interface, boot-up, configurations, etc . . . ).

In some embodiments, the processor 165 may execute instructions in the code 160 to measure total jitter in the input signal 110 and resolve the measured total jitter into $J_H$ and $J_V$. In one example, the NVM 145 may store measurement results from previous experiments so that a user can use the previous results for analysis, such as before-and-after studies on equipment modifications. In another example, the NVM 145 may include instructions that, when executed by the processor 165, perform operations to boot-up the system 100, store acquired samples of the input signal 110, and analyze the samples to determine horizontal and/or vertical components of jitter. In some embodiments, the NVM 145 may store information about the DO 105, such as impedance and/or frequency response information. In some applications, digital filtering, including IIR and/or FIR filters, may be used to improve or tailor the nominal frequency response of the channel. Such filters may provide a substantially flat frequency response over a frequency range, an effective bandwidth responsive to user input, high frequency noise compensation, and/or a desired frequency response. In some cases, the system 100 may include channel compensation that may effectively reduce horizontal and/or vertical jitter.

In certain embodiments, digital filtering, noise compensation, and frequency response tailoring may be used may be employed to measure and/or adjust observed jitter in waveform acquisition systems such as those described herein. Suitable digital filtering and associated methods that may be used in conjunction with the systems described herein include embodiments that are described in U.S. Pat. No. 6,701,335, which issued to Pupalaikis on Mar. 2, 2004, and which is assigned to the assignee of the present application. The present application incorporates the Detailed Description and the Figures of U.S. Pat. No. 6,701,335 herein by reference.

In further embodiments, intrinsic jitter information of the signal measurement system 100 is stored in the NVM 145. When measuring the input signal 110, for example, apparatus in the DO 105 may add, for example, thermal noise and/or quantization noise that may increase the measured vertical and/or horizontal jitter. Jitter added to the input signal 110 may be referred to as intrinsic jitter.

In some embodiments, the intrinsic jitter may be partly or substantially predetermined by design or by testing, either at manufacturing or at calibration, for example. In some implementations, impedance information may be stored in the NVM 145 and may be used to determine an estimate of horizontal and/or vertical intrinsic jitter. In some further embodiments, a look-up table or characteristic curve may be provided to determine expected values for horizontal and/or vertical intrinsic jitter based on measurement set-up. For example, the impedance of the source and/or transmission line for the input signal 110 may be determined, such as by auto-detection techniques or by user provided input. Based on the external impedance information, and/or other factors such as channel bandwidth (which may be variable) in the DO 105, the processor 165 may be programmed to identify estimates for horizontal and/or vertical intrinsic jitter.

The system 100 can use intrinsic jitter information, for example, to estimate horizontal and/or vertical jitter of the input signal 110 by subtracting (using, for example, quadrature subtraction) horizontal and/or vertical jitter contributed by the signal measurement system 100.

The system 100 also includes a display driver 175 and a user interface (UI) 180. The display driver 175 may format and send images for display on a display device (not shown) in the UI 180. For example, the display driver 175 can send for display overlapping samples of a periodic waveform so that an operator can view an eye diagram that visually illustrates jitter in the measured input signal 110. An operator can use the UI 180 to input commands and/or information to set-up and/or control operation of the system 100. In some embodiments, the operator may use the UI 180 to input measurement set-up parameters. The set-up parameter may include, for example, number of periods of the input signal 110 to acquire, acquisition methods, pattern length, and/or bit rate of the data pattern. In another example, the operator may use the UI 180 to initiate an analysis of horizontal and/or vertical components of jitter.

Using the signal measurement system 100, the operator may determine an estimate of jitter measurement of the input signal 110 after accounting for intrinsic jitter contributed by the system 100. For example, the operator may set up analysis by connecting the input signal 110 and the clock signal 135 to the DO 105. In another example, the operator may set up analysis without connecting the CLK input 135 in modes for which it is not required. From the UI 180, the operator may select an acquisition mode for the acquisition module 120 and associated component. The UI 180 may also permit the user to input information about the data pattern, such as the bit rate and the pattern length, the sampling interval of the data acquisition, and whether the sampling is triggered by the CLK input 135.

In various embodiments, the acquisition mode may be a CIS mode, a real-time acquisition, or an ET acquisition. The user may select the acquisition mode based on, at least partially, some characteristics of the input signal 110. Selection of the acquisition methods are described in further detail with reference in FIG. 3.

The processor 165 can initiate the acquisition module 120 to sample the input signal 110 via the input interface 115. The acquisition module 120 can convert the analog input signal 110 into digital samples using the ADC 125 and store the digitized data in the memory 150. The processor 165 can then use the data to perform a jitter analysis operation. In the jitter analysis operation, the processor 165 may instruct the math coprocessor 170 to perform some of the data manipulation and numerical algorithms functions. In some embodiments, the jitter analysis operation may include generating an eye diagram to estimate the total jitter in the input signal 110 and separate the total jitter into $J_V$ and $J_H$. The processor 165 can then retrieve a previously measured $J_{IV}$ and $J_{IH}$ from the NVM 145 or the memory 150. The processor 165 can then determine $J_{SV}$ and $J_{SH}$ by subtracting, such as using quadrature subtraction, $J_{IV}$ from $J_V$ and $J_{IH}$ from $J_H$.

Figure 2:
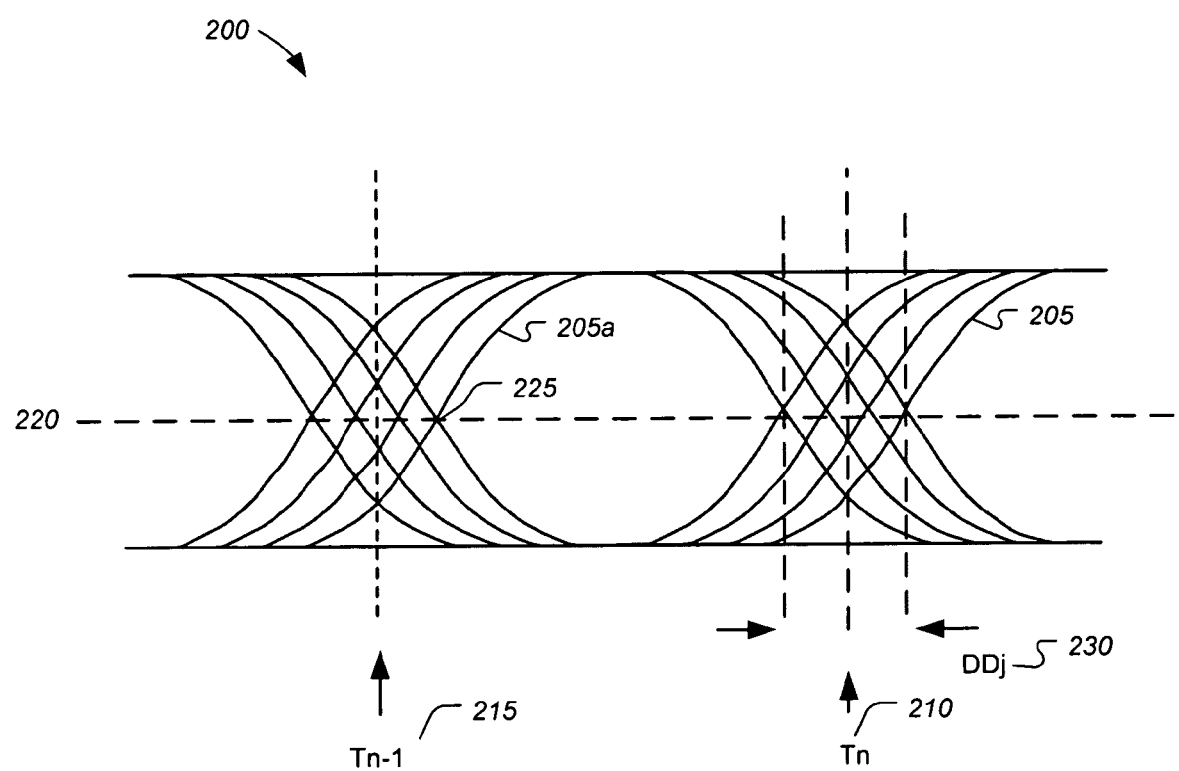
FIG. 2 shows an exemplary eye diagram that a digital oscilloscope (DO) may generate.

FIG. 2 shows an exemplary eye diagram 200 that the system 100 may generate when the system 100 is performing jitter analysis on the input signal 110. From the eye diagram 200, the system 100 can measure some jitter quantities, such as DDj and edge-to-reference time interval error at the nth transition ($TIE_n$), in the input signal 110. Additionally, from the eye diagram 200, the system 100 may also deduce the total jitter and random jitter from the eye diagram 200.

The system 100 may generate the eye diagram 200 by superimposing traces of digitized data samples of a unit interval (UI), such as the duration of a data bit in the communication system under test. For example, the system 100 can plot the input signal 110 against time on a unit-interval axis. At the end of the unit-interval, the system 100 returns to the beginning of the time axis and continue plotting, without removing previously displayed traces. Then the eye diagram 200 can include many overlapping curves. In this example, the eye diagram 200 includes multiple traces 205 of the input signal 110. The eye diagram 200 also includes an expected time 210 of the n-th transition for a jitter free signal at Tn and an expected time 215 of the (n–1)-th transition for a jitter free signal at Tn–1. As shown, the eye diagram 200 includes a predefined voltage threshold 220. If the input signal 110 is jitter free, then the nth transition and the (n–1)-th transitions of the input signal 110 are expected to cross the predefined voltage threshold 220 at times 210 and 215 respectively. The system 100 can determine the $TIE_n$ by comparing an actual transition time of the nth transition and the expected transition time 210. As an example, one of the traces 205a may have an actual transition time 225. The system 100 can then determine that the $TIE_n$ of the trace 205a by subtracting the actual transition time 225 and the expected transition time 215. In some examples, the system 100 may obtain a number of $TIE_n$ from a data sample of the input signal 110 and determine an average $TIE_n$ among the data sample.

From the eye diagram 200, the system 100 can also obtain DDj of the input signal 110. As shown, the system 100 may determine a DDj 230 at the nth transition of the input signal 110, which is the peak-to-peak variation of the transition time.

The system 100 may also determine total jitter of the input signal 110 by analyzing the eye diagram 200. In some embodiments, the system 100 may generate a histogram of the $TIE_n$.

The system 100 can then analyze the histogram and determine the total jitter by, for example, computing the variance of the histogram. Then the system 100 can separate the measured total jitter into $J_H$ and $J_V$ and eliminate the intrinsic jitter from the total jitter. Additionally, the system 100 can also obtain other information from the histogram such as a confidence interval of more than 50% of the measurement will be contained in the interval, expected peak-to-peak value that would be observed for the theoretical number of measurement, or a confidence interval for a specified bit error rate (BER).

The system 100 can also measure random jitter from the eye diagram 200. In some embodiments, the system 100 may estimate RJ as a quantity in a specific probability distribution, such as a Gaussian distribution. Then the system 100 may characterize random jitter by measuring characteristic quantity of the distribution. For example, if the probability distribution of the random jitter is Gaussian distribution, then the system 100 may measure the mean and probabilistic amplitude, such as a variance, of the random jitter distribution as a measure for the random jitter.

In one exemplary embodiment, the jitter contributed by the DO 105 may be dominated by amplitude (vertical) jitter (e.g., due to thermal noise). As such, the intrinsic jitter is primarily vertical jitter, and the horizontal intrinsic jitter may be considered negligible. Also in this example, the jitter on the input signal 110 is dominated by horizontal jitter (e.g., due to quantization noise). As such, the jitter on the input signal 110 is primarily horizontal jitter, and the vertical signal jitter may be considered negligible. In this example, the system 100 may resolve the measured total jitter into horizontal and vertical components according to a method such as that described with reference to FIG. 5. Accordingly, the signal jitter may be estimated to be approximately equal to the horizontal component of the total jitter. In other exemplary embodiments, the intrinsic jitter may be substantially horizontal jitter and the signal jitter may be substantially vertical jitter. Further details are described with reference to FIG. 3.

Figure 3:
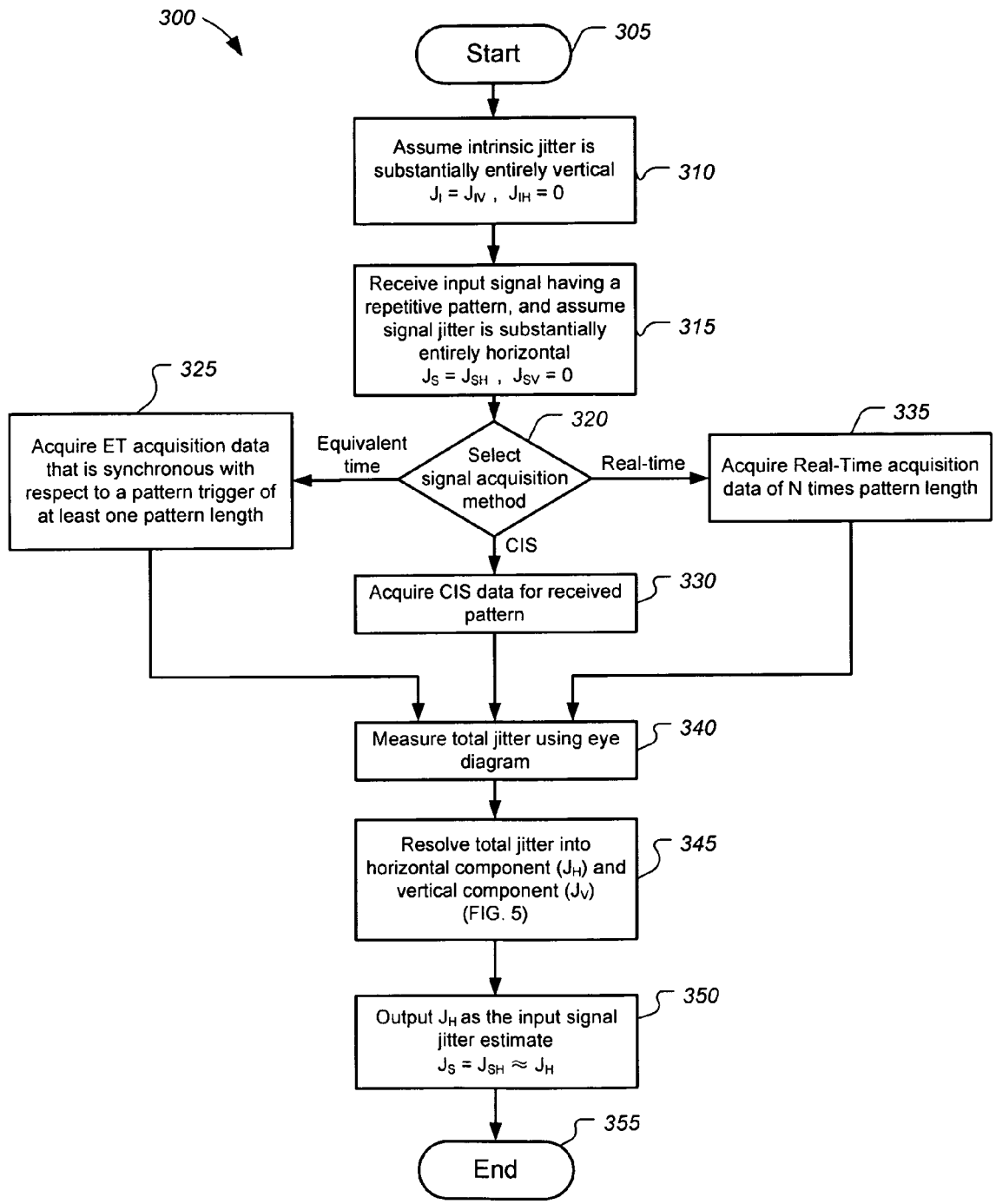
FIG. 3 is a flowchart that shows an exemplary method for measuring jitter in a signal measuring system.

FIG. 3 is a flowchart that shows an exemplary method 300 for measuring jitter in the signal measuring system 100. For example, the method 300 may be performed by the system 100. As an example, the system 100 may execute the method that is implemented as the code 160 in the system 100. The method 300 may begin in step 305 when the system 100 receives a command to determine an estimate of jitter in the input signal 110, which may be a repetitive signal, a NRZ data pattern, or a RZ data pattern, for example.

In step 310 of this example, the system 100 is configured to assume that intrinsic jitter in the signal measurement system 100 is substantially entirely vertical. In other examples, the intrinsic jitter may be assumed to be substantially entirely horizontal. The system 100 may identify the intrinsic jitter, for example, by executing an internal test. In some embodiments, the system 100 may perform a test to measure the noise floor of the signal measurement system 100. In some further embodiments, the system 100 may retrieve results of intrinsic jitter measurements that are stored in NVM 145. For example, the system 100 may retrieve intrinsic jitter of the signal measurement system 100 from the NVM 145 that may be, for example, predefined in manufacturing process, or measured during previous oscilloscope calibration operations. In some embodiments, the system 100 may estimate the intrinsic jitter by resolving intrinsic jitter ($J_I$) into $J_{IH}$ and $J_{IV}$. In another example, the system 100 may identify the intrinsic jitter value by reading predefined values of $J_{IH}$ and/or $J_{IV}$ that were stored in the NVM 145 during a manufacturing process, for example.

Next, in step 315, the system 100 may begin to receive a repetitive pattern, which in this example, may include receiving the input signal 110. In this example, the system 100 is configured to assume that jitter of the input signal 100 is substantially entirely horizontal. In other examples, the signal jitter may be assumed to be substantially entirely vertical. In one embodiment, the fitting may be of a periodic clock, i.e., with a single cycle pattern. In other embodiments, the data may be serial data (e.g., RZ, NRZ).

When the DO 105 is receiving the repetitive pattern, the system 100 may collect data for jitter analysis by selecting a signal acquisition method to in step 320. In some examples, because the input signal 110 is a repetitive signal, the system 100 can acquire data using the ET sampling. If, in step 320, the system 100 selects to use the ET sampling to acquire data for jitter analysis, then the system 100 may acquire data of at least one pattern length with respect to a pattern trigger in step 325. Using the ET sampling, the system 100 can build a picture of the waveform over time, as long as the data pattern repeats itself. As an example, the system 100 may sample the input signal 110 relative to a pattern trigger, such as a rising edge of the clock signal 135. Since the input signal 110 is repetitive, the system 100 may collect data samples by sampling the input signal 110 at different relative positions in the pattern on successive cycles of the pattern.

If the system 100 selects to use the CIS (coherent interleaved sampling) mode to acquire the repetitive data pattern in step 320, then the system 100 may, in step 330, acquire CIS data for the received pattern. In various embodiments, the CIS mode can present a serial data pattern as a superposition of many acquisitions of the same repeating pattern. Without a precise hardware pattern trigger, given only the correct bit rate and pattern length, the CIS may yield substantially phase-synchronized or —invariant data. If the input signal 110 is a fixed repeating pattern of serial data (RZ or NRZ pattern), for example, then the operator may select the CIS mode. As another example, the operator may select the CIS mode when it is required to lock the received repetitive pattern for inter-symbol interference (ISI) and/or DDj analysis. The system 100 may analyze the acquired data to obtain sufficient absolute phase information to present the pattern as expected, and to correlate the noise components with specific bits in the pattern. In some embodiments, the system 100 may perform post-processing operations to restore the sampled data to create a full pattern.

If a bandwidth of the input signal 110 is within the bandwidth capabilities of the system 100, the system 100 may select real-time acquisition in step 320 and acquire real-time acquisition data of N times the pattern length in step 335. For example, the system 100 may acquire a data pattern using a single-shot mode to collect data, such as pattern length, pattern frequency, and pattern content, from a single acquisition. In the single shot mode, the system 100 may only be triggered once to acquire a sequence of samples of the repeating input signal pattern.

After the system 100 samples the received data pattern in step 325, 330, or 335, the system 100 measures total jitter in step 340 by constructing an eye diagram, such as the eye diagram 200, from the collected data. In some embodiments, the system 100 can deduce random jitter and data dependent jitter in the input signal 110 and determine total jitter from the eye diagram 200. For example, the system 100 may generate a histogram from the eye diagram to determine the variance of the TIE (time interval error) in the received data pattern and/or to measure the total jitter in the received data pattern. Next, the system 100 may, in step 345, resolve total jitter into horizontal $J_H$ and vertical $J_V$ components. In various embodiments, the system 100 may resolve measured total jitter into $J_H$ and $J_V$ by correlating the variance of the rate of change of the signal and the variance of measured noise in the signal. An exemplary method for separating total jitter into $J_H$ and $J_V$ is described in further detail with reference to FIG. 5.

In step 350, the system 100 may output $J_H$ as the input signal jitter estimate. For example, the processor 165 may cause information about the result to the display driver 175 for display in text and/or graphical form. The method 300 ends at step 355.

In other applications, information about the horizontal and/or vertical components of the intrinsic jitter may be predetermined, by measurement or by reference to a look-up table, for example. After the system 100 resolves the total jitter into horizontal and vertical components, each component may be further processed by removing the corresponding horizontal and vertical intrinsic jitter components using quadrature subtraction, for example. Thus, having information about the magnitudes of the intrinsic jitter components may be used to refine the estimate of signal jitter components. Further details are described with reference to FIG. 4.

Figure 4:
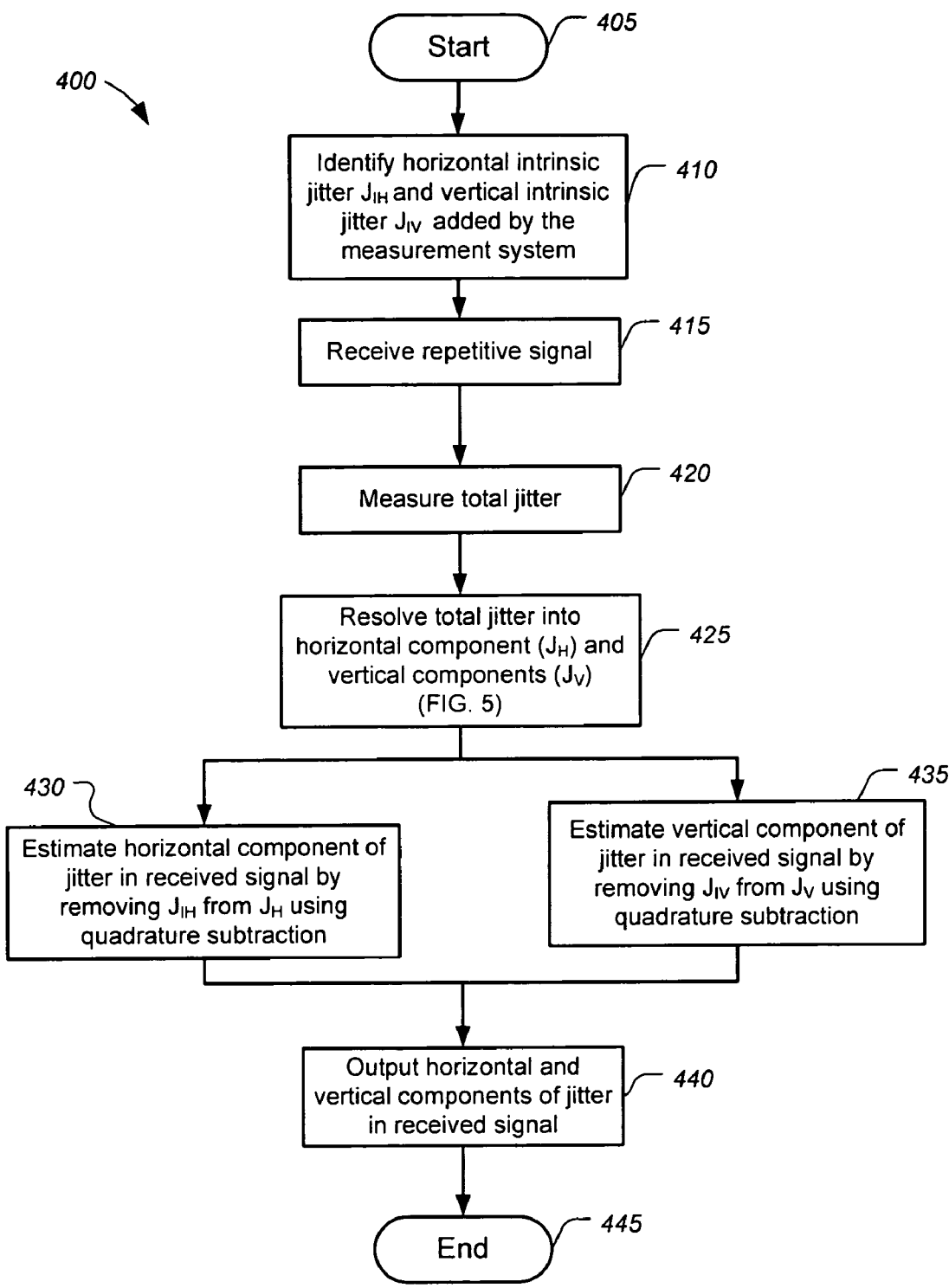
FIG. 4 is a flowchart that shows an exemplary method for measuring horizontal jitter and vertical jitter in a signal measurement system.

FIG. 4 is a flowchart that shows an exemplary method 400 for determining horizontal jitter and vertical jitter of the input signal 110 using the signal measurement system 100. In this example, the system is not configured based on an assumption that the intrinsic jitter is substantially entirely vertical and that the signal jitter is substantially entirely horizontal (or vice versa). Rather, in this example, the system 100 identifies values for horizontal and/or vertical components of intrinsic jitter, and uses those identified values to determine estimates for horizontal and/or vertical components of jitter on the input signal 110. As an example, the system 100 may perform the method 400 when the processor 165 is executing the code module 160.

The method 400 begins at step 405 when the system 100 receives a command to determine horizontal jitter $J_{SH}$ and vertical jitter $J_{SV}$ in the input signal 110. In step 410, the system 100 identifies horizontal intrinsic jitter $J_{IH}$ and vertical intrinsic jitter $J_{IV}$ for the system 100. The $J_{IH}$ and $J_{IV}$ may be determined using methods as described with reference to FIG. 3, for example. Then the DO 105 receives, in step 415, a repetitive signal. For example, the system 100 may receive the repetitive signal and sample the received signal using the ET acquisition method, the CIS acquisition method, or the real-time acquisition method, as described with reference to FIG. 3. In step 420, the system 100 measures total jitter in the input signal 110 using the sampled data. Next, the system 100 resolves total jitter into horizontal $J_H$ and vertical $J_V$ components in step 425. An example method to resolve total jitter into horizontal and vertical components is described in further detail with reference to FIG. 5.

In some examples, the jitter may be substantially random. Using the results of step 425, the system 100 estimates the horizontal component of jitter in the received signal $J_{SH}$ using quadrature subtraction (see Eq. 1) of horizontal intrinsic jitter $J_{IH}$ from the total horizontal jitter $J_H$ in step 430. In step 435, the system 100 estimates the vertical component of jitter in the received signal $J_{SV}$ using quadrature subtraction (see Eq. 2) of vertical intrinsic jitter $J_{IV}$ from the total vertical jitter $J_V$.

$$J_{SH} = \sqrt{\sqrt{J_H^2 - J_{IH}^2}} \quad (1)$$

and $$J_{SV} = \sqrt{\sqrt{J_V^2 - J_{IV}^2}} \quad (2)$$

Then, in step 440, the system 100 outputs the estimates of $J_{SH}$ and $J_{SV}$ in the received signal. A communication engineer, for example, may use estimates of $J_{SH}$ and $J_{SV}$ to better evaluate the reliability, signal margin, or dependability of a high frequency data channel and/or data path. The method 400 ends at step 445.

Figure 5:
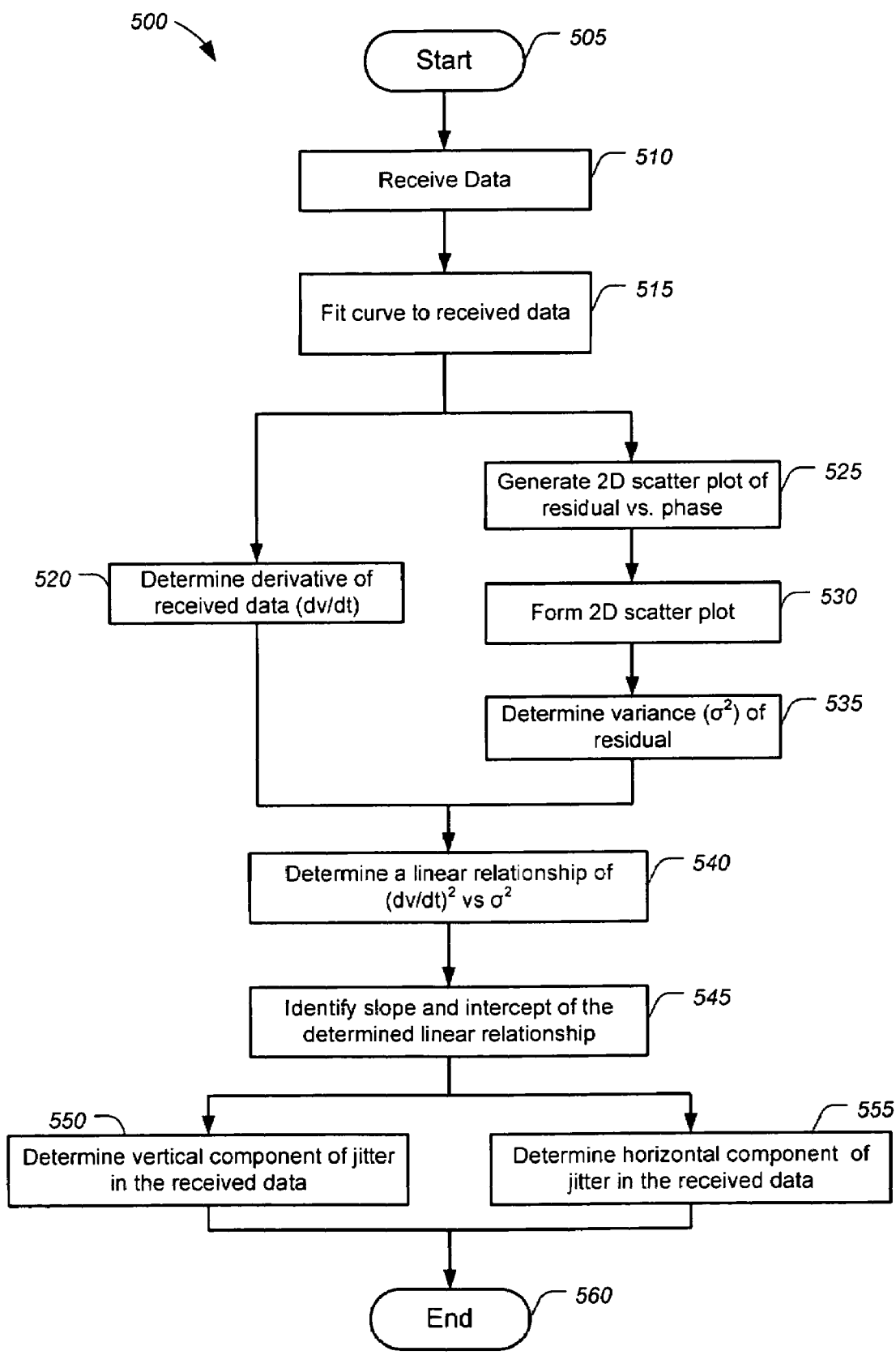
FIG. 5 shows a flowchart of an exemplary method that the processor 165 may perform to resolve composite jitter into vertical jitter and horizontal jitter.

FIG. 5 shows a flowchart of an exemplary method 500 that the processor 165 may perform to resolve total jitter into $J_V$ and $J_H$. In some examples, determining $J_H$ and $J_V$ may be based on a number of assumptions. For example, one assumption may be that the jitter processes are stochastic and stationary, and the $J_H$ and $J_V$ are uncorrelated. In one embodiment, the system 100 can use a generated statistical correlation between $\sigma^2$ and $(dv/dt)^2$ to predict the relative proportions of vertical jitter ($J_V$) and horizontal jitter ($J_H$) present in a measured total jitter. In some embodiments, the processor 165 may use the math coprocessor 170 to perform some of the mathematical operations in the method 500.

In this example, the method 500 may begin in step 505 when initiated as a sub-routine, for example, in step 345 of FIG. 3. In step 510, the processor 165 receives data from the NVM 145 or the memory 150. The data may be samples of the input signal 110 acquired by the system 100 using the ET sampling acquisition, the CIS acquisition, or the real-time sampling acquisition. Then, the processor 165 can fit a curve to the received data in step 515 to determine an approximate function f(t) of the input signal 110. For example, the processor 165 may fit the received data using a method derived from first principles using numerical approximation methods, such as Newton's method and simple extremal analysis. In some embodiments, the processor 165 may first fit the received data using a least-square sinusoidal fit algorithm. Using the least-square sinusoidal fit algorithm, the processor 165 may fit the received data into a sinusoidal function and obtain best-fit parameters of the received signal, such as a best-fit fundamental frequency of the signal. Then, the processor 165 may construct the Fourier components of the repetitive signal by determining discrete Fourier sums at each harmonic of the fundamental frequency of the input signal 110s. Each of the discrete Fourier sums yields both phase and magnitude of the corresponding harmonic component. In one embodiment, eleven harmonics may be calculated to reconstruct the periodic signal. In other embodiments, the processor 165 may also compute between two and at least about twenty or more harmonics, depending on the accuracy and processing time requirement for the curve fitting operation.

Once the processor 165 determines all the required harmonic terms, the processor 165 determines a derivative of the received data (dv/dt) in step 520 from the fitted curve. An example of the dv/dt of the input signal 110 will be described in further detail with reference to FIG. 6A.

The processor 165 may, in step 525, determine periodic residuals of the fitted curve to generate a 2D scatter plot of residual vs. phase for an entire bit period of the original signal. In some embodiments, the processor may compute the periodic residuals ($r_k$) at each sampling time ($t_k$) using the following equations:

$$r_k = y_k - f(t_k) \quad (3)$$

where $y_k$ is the actual measured signal voltage level at time $t_k$. Then, the processor 165 accumulates the periodic residuals into a persistence map, which is stored as a 2-dimensional array, to form a scattered plot in step 530. In one example, the processor 165 may generate the scatter plot by first determining for each $t_k$ a corresponding phase angle, from 0 to $2\pi$, of the fundamental frequency. In some embodiments, the processor 165 may compute an angle, where $2\pi$ may represent the time of a full period of the fundamental frequency, of each $t_k$ and modulate the angle by $2\pi$. For example, the processor 165 may be configured to compute the angle by:

$$\phi_k = \omega \cdot (t_k + \phi_0) \quad (4)$$

where $\phi_k$ is the corresponding angle, $\phi_0$ is the starting phase that may be obtained from the best fit curve, $\omega$ is the fundamental frequency, and $\Delta t$, which is the duration of a sampling interval, or the time between adjacent samples $t_k$. Then the processor may modulate $\phi_k$ by $2\pi$ to determine the phase angle corresponding to $t_k$.

In the persistence map, the processor 165 may define each column of the array to be a range of angles between 0 to $2\pi$. The processor 165 may also define some number of rows for the observed range of residuals. In other words, the processor 165 may form a scattered plot by plotting $r_k$ in the vertical axis against modulated phase angle in the horizontal axis. The persistence map is described in further detail with reference to FIG. 6B.

In some embodiments, all the periodic residuals may be accumulated into the persistence map. The fitting procedure may promote proper phasing. Thus, a large amount of data can be accumulated and the processor 165 may perform statistical operations to characterize noise relative to the shape of the received data.

Next, the processor 165 can determine variance of residual ($\sigma^2$) in step 535. In some embodiments, the processor 165 may generate a histogram for each column in the scatter plot. Then, for each histogram, the processor 165 can determine the variance of the distribution in the histogram. In other embodiments, the processor 165 may first calculate the mean for each column of the scattered plot. Then the processor 165 may calculate the variance for each column using standard statistical definition of variance.

After the processor 165 determines dv/dt in step 520 and $\sigma^2$ in step 535, the processor 165 determines, in step 540, a linear relationship between $(dv/dt)^2$ and $\sigma^2$. In some embodiments, the processor 165 may first determine $(dv/dt)^2$ at each phase angle from 0 to $2\pi$ corresponding to each $t_k$, similar to the phase angle modulation operation performed in step 525. Then, the processor 165 may perform a linear least square fit using $(dv/dt)^2$ and $\sigma^2$ pairs at each phase angle. In some embodiments, the determined linear relationship, such as the result of the linear least square fit or other linear regression method, may result in a linear function of the form $$\sigma^2 = m \cdot (dv/dt)^2 + b \quad (5)$$

where the parameters m and b are obtained from the fitting operation.

Next, in step 545, the processor 165 may identify slope and intercept of the determined linear relationship. For example, in equation (4), the processor 165 can identify that the slope is the best-fit parameter m n and the intercept of the equation (4) is the parameter b. Then, the processor 165 can determine a vertical component of jitter in the received data in step 550 and determine horizontal component of jitter in the received data in step 555. In some embodiments, the processor 165 may use a statistical correlation of time dependent noise and time independent noise in the following form.

$$\sigma^2 = \sigma_v^2 (dv/dt)^2 + \sigma_h^2 \quad (6)$$

Thus, the identified slope, m in (5) or $\sigma_v^2$ in (6), gives a measure of the $J_V$, which is timing independent noise. The intercept, b in (5) or $\sigma_h^2$ in (6), yields a measure of the $J_H$, which is timing dependent noise. In one example, the processor 165 may output the $\sigma_v^2$ and $\sigma_h^2$ as a direct result. In other examples, the processor 165 may convert the quantity the $\sigma_v^2$ and $\sigma_h^2$ into other quantities, such as bit error rate or confidence level, and output the converted quantities. After the vertical and horizontal components of jitter are determined, the method 500 ends at step 560.

Figure 6A:
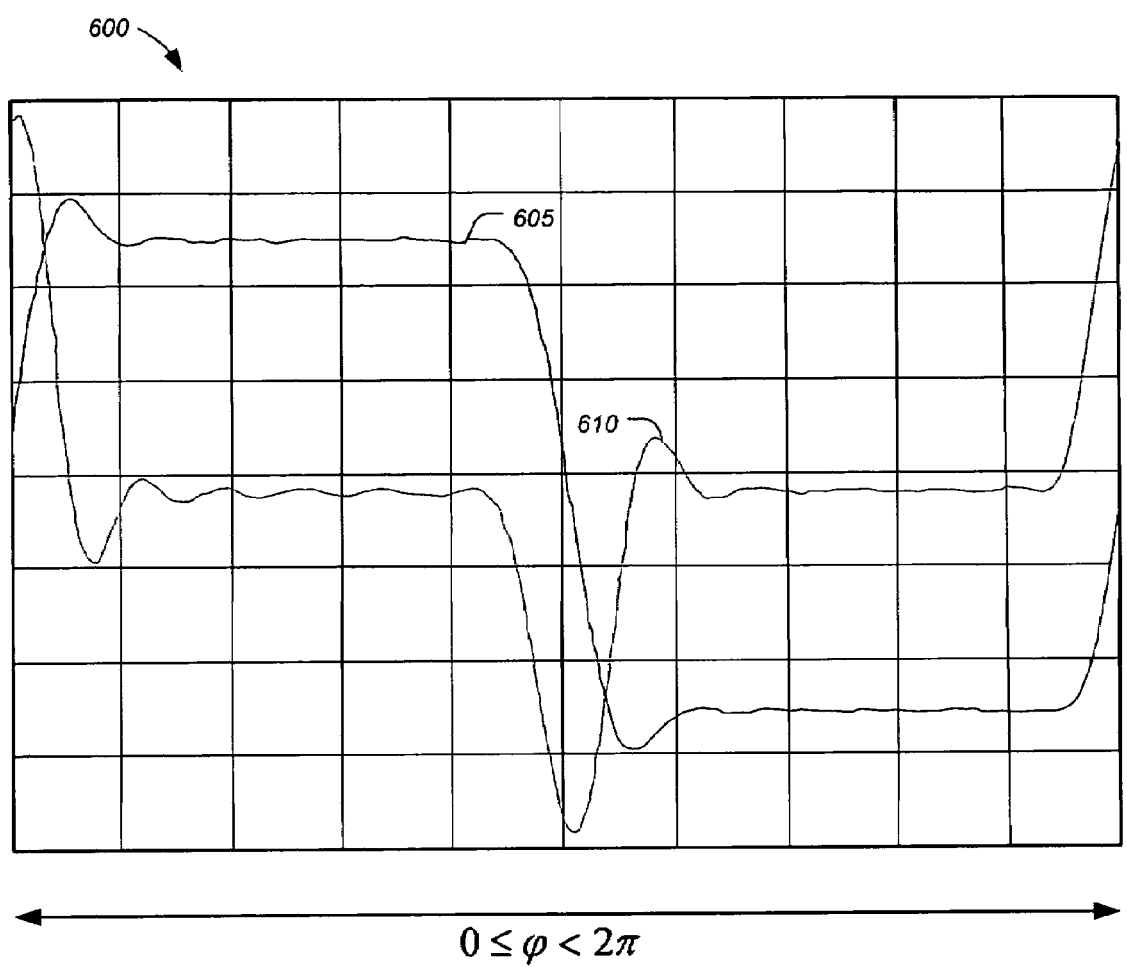
FIGS. 6A-6C are displays showing the exemplary intermediate outputs of a DO when the DO is resolving a composite jitter into horizontal component and vertical component of the composite jitter.
Figure 6B:
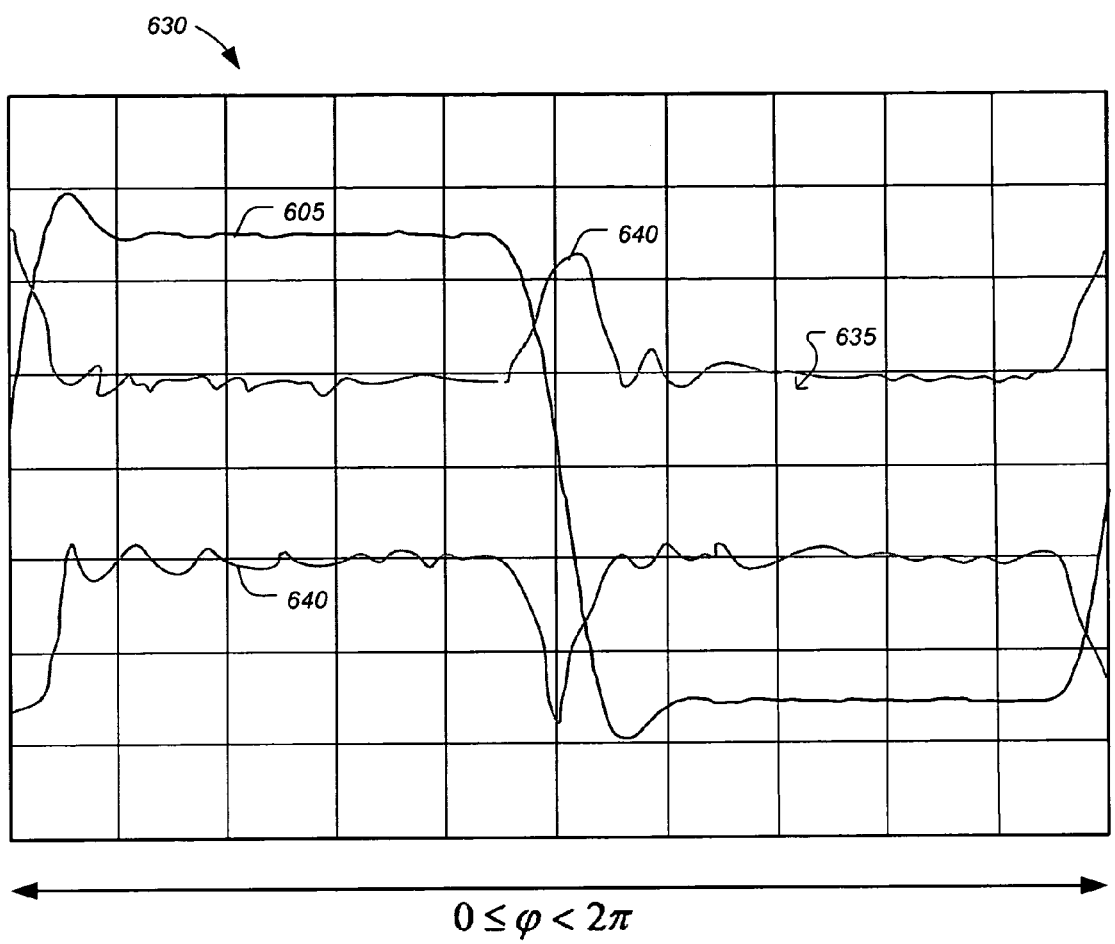
Figure 6C:
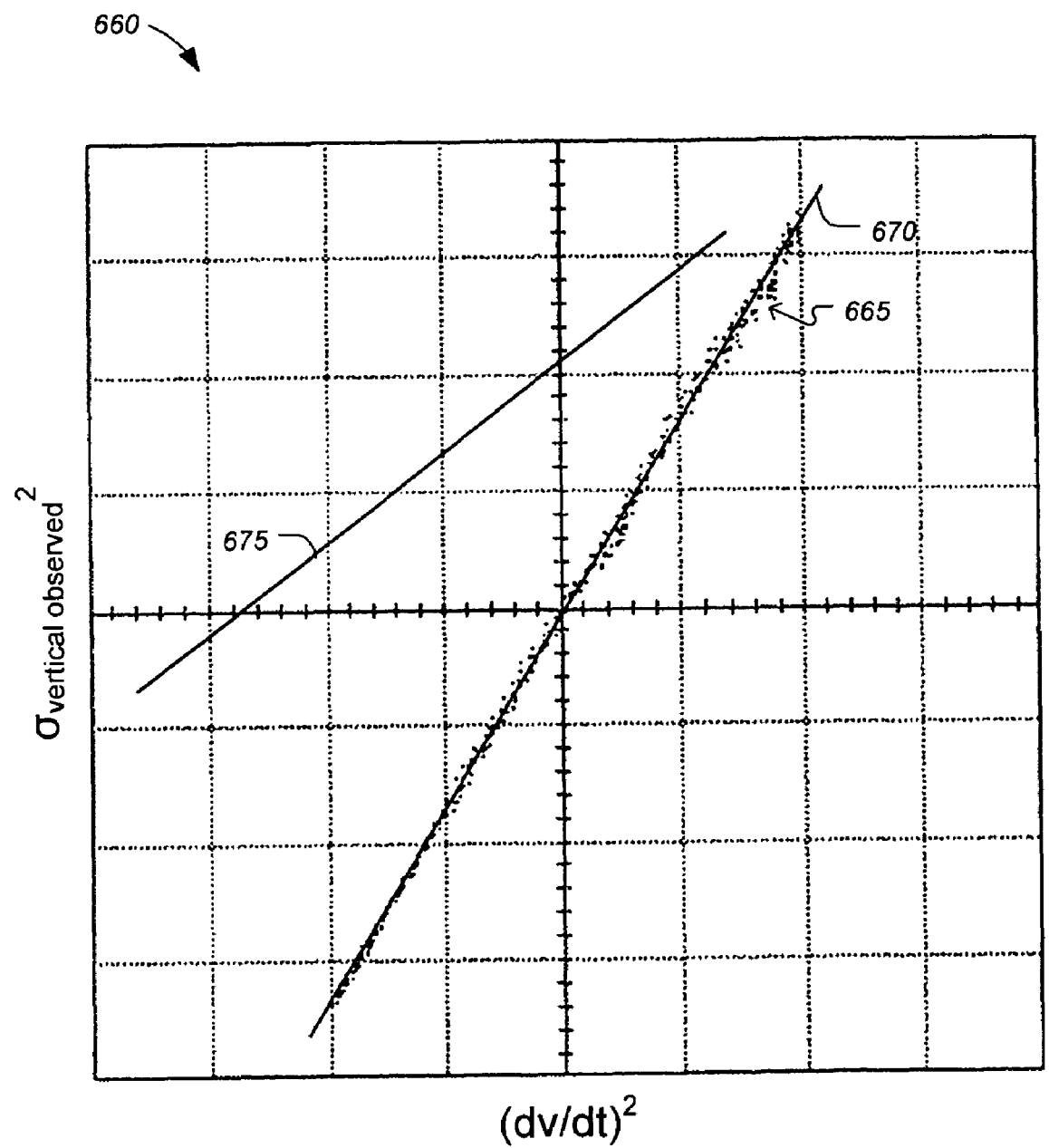
Figure 7:
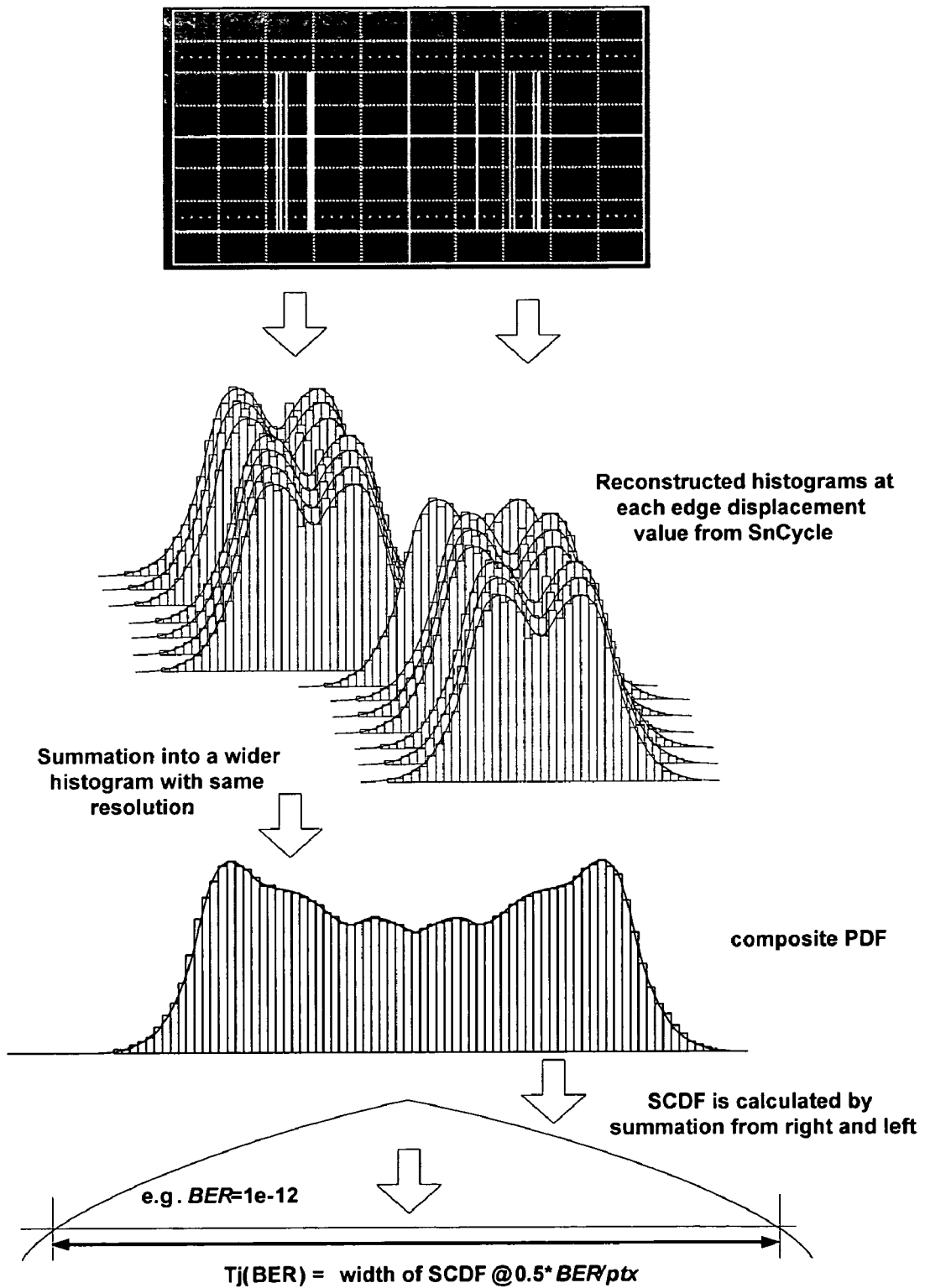
FIG. 7 illustrates generation of histograms to provide a composite probability distribution function.
Figure 8:
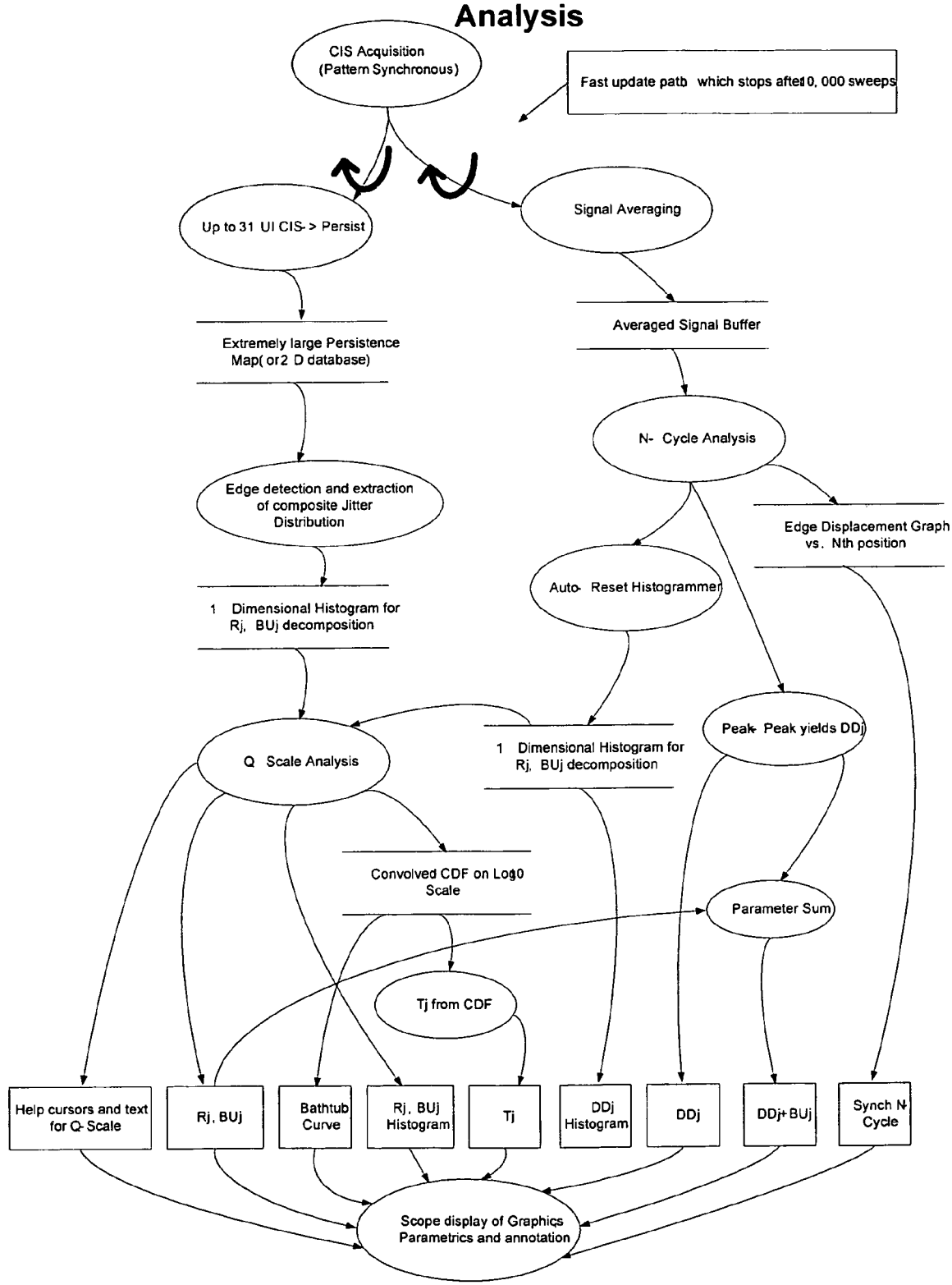
FIGS. 8-11 illustrate an exemplary method for jitter analysis of signals with repeating patterns.
Figure 9:
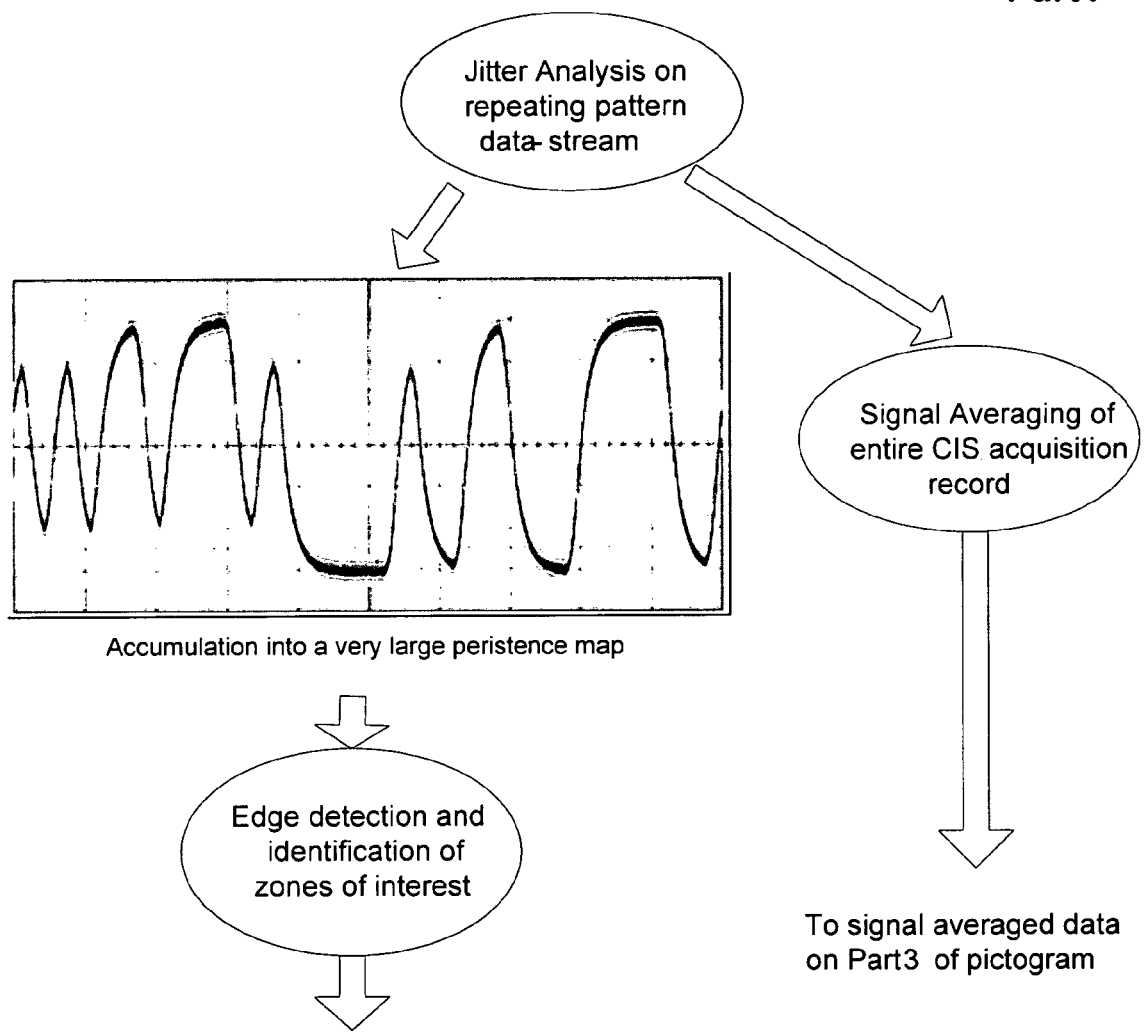
Figure 10:
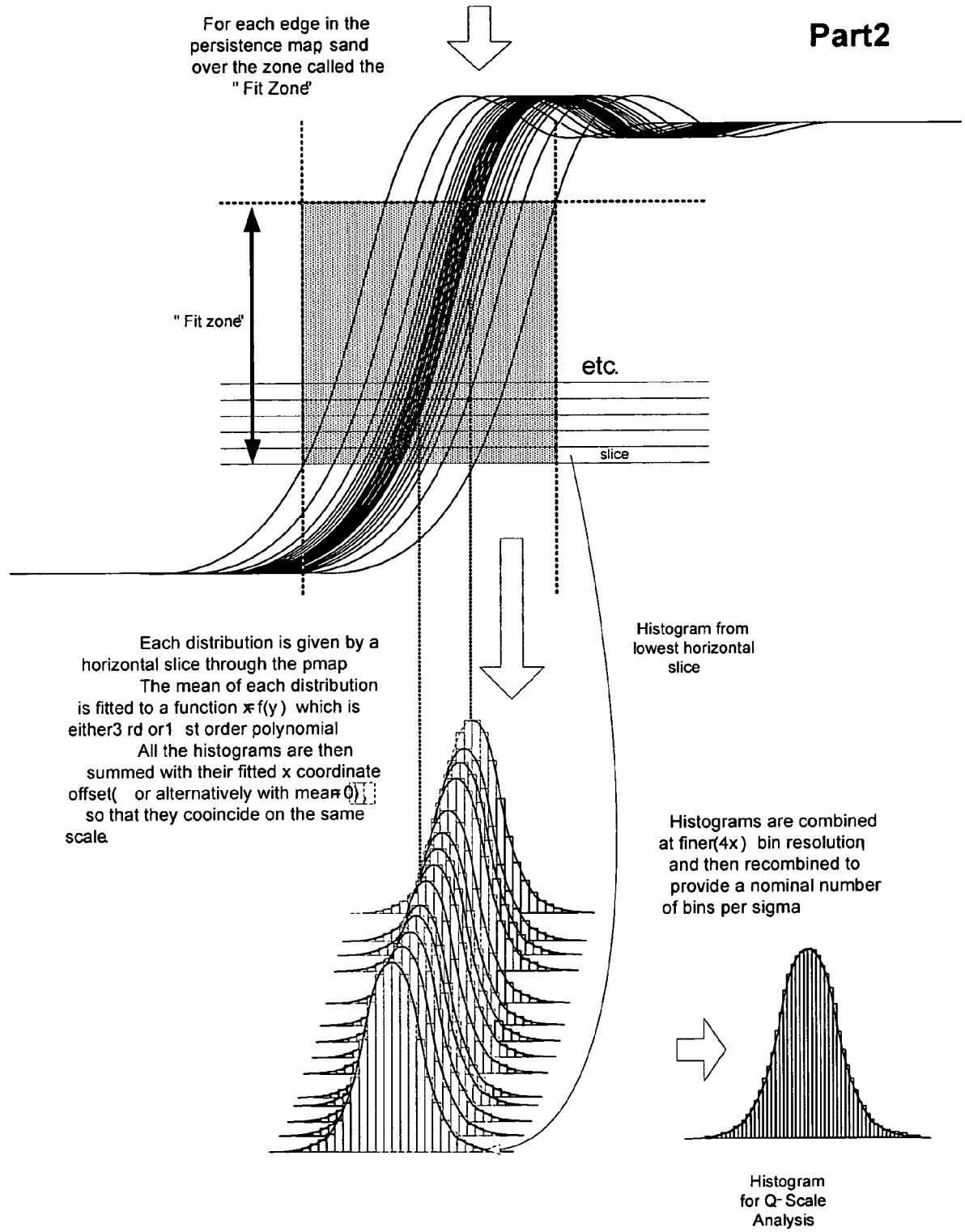
Figure 11:
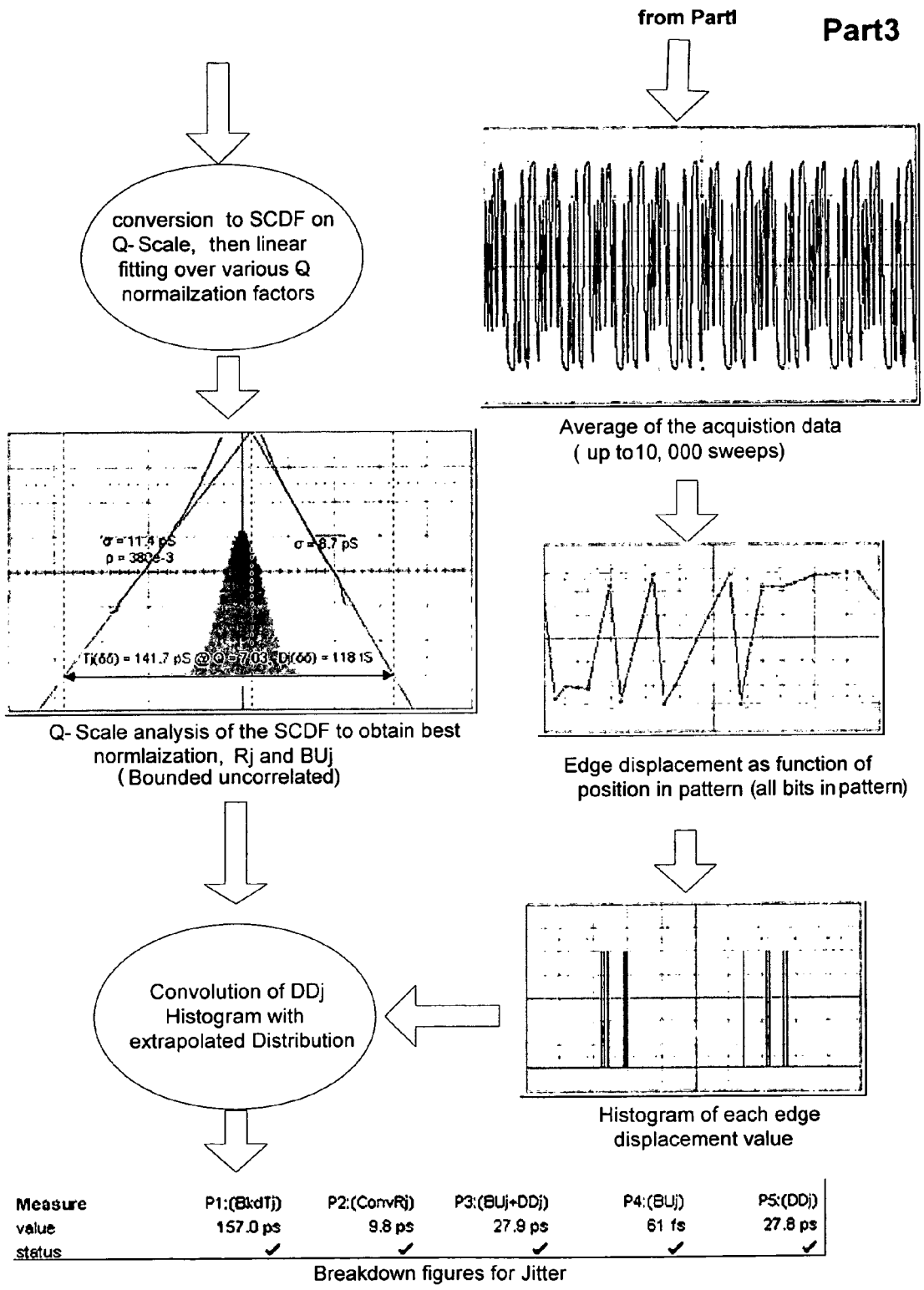

The method 500 for resolving total jitter into $J_V$ and $J_H$ may be described graphically according to FIG. 6A-6C, which shows plots of exemplary intermediate outputs of the system 100. In some embodiments, the system 100 may determine dv/dt, form a 2-dimensional scattered plot of periodic residuals, and generate a plot of $(dv/dt)^2$ vs. $\sigma^2$ before obtaining the statistical relationship between the variance of the residual ($\sigma^2$) and the rate of change of the input signal (dv/dt). Referring to FIG. 6A, a display 600 of the system 100 shows a trace 605 of a reconstructed periodic clock waveform and a trace 610 of the rate of change for the reconstructed clock signal. In some embodiments, the waveform may be reconstructed from a substantially periodic clock, for example. In some other embodiments, the waveform may be reconstructed from a 2D scatter plot representation of a serial data signal having a repetitive pattern. In such embodiments, the same method may be used to obtain dv/dt for a plurality of horizontal phases in the pattern.

In the display 600, the horizontal axis represents phase angles from 0 to $2\pi$, which may represent relative time in a period of the input signal 110. As shown, the system 100 is displaying a full period of the trace 605. In some embodiments, the processor 165 may fit a curve to the received input signal 110 by computing the discrete Fourier sums of the fundamental frequency and the harmonics of the input signal 110. The processor 165 can reconstruct the input signal 110 from the discrete Fourier sums. In this example, the processor 165 may reconstruct a periodic clock input and displayed on the display 600.

From the trace 605, the processor 165 can determine the trace 610 by, for example, differentiating the fitted curve. In one embodiment, the processor 165 may be configured to differentiate curves that are represented by the Fourier coefficients obtained during the curve fitting operation. In another embodiment, the processor 165 can generate a plurality of data points using the fitted curve and compute dv/dt using the generated data points. For example, the processor 165 may determine dv/dt at each data point by averaging the slope between the data point and its adjacent data points.

Referring to FIG. 6B, an exemplary 2-dimensional scattered plot 630 of the trace 605 is shown. The scattered plot 630 includes an area 635 that includes most of the periodic residuals of the periodic fit at each phase angle between 0 and $2\pi$. After performing the periodic fit, the processor 165 may generate the scattered plot 630 by plotting the periodic residuals at each $t_k$ in the column corresponding to $t_k$, as described with reference to FIG. 5. As shown in FIG. 6B, the scattered plot also includes three sigma boundaries 640. For example, the three-sigma boundaries 640 may show an envelope that the processor 165 determine an approximately 99.73% of the periodic residual may be estimated to lie within the boundaries 640. In other embodiments, the boundary may be more or less than three-sigma, such as between 0.5 and 3 sigma, or from three-sigma to at least about six-sigma, for example. In some embodiments, the processor 165 may determine the shape and position of the envelope by generating a histogram of the periodic residuals at the columns and by computing the variance at each of the columns. Using the variance information and the computed dv/dt in FIG. 6A, the processor 165 can determine horizontal jitter and vertical jitter in the measured total jitter by fitting a linear relationship between $\sigma^2$ and dv/dt.

Referring to FIG. 6C, the system 100 may display an exemplary scatter plot 660 of $\sigma^2$ verses $(dv/dt)^2$. The scattered plot 600 includes a collection of paired data set 665. As discussed with reference to FIG. 5, the processor 165 may determine the $J_V$ and $J_H$ in the measured total jitter by generating a statistical correlation between $\sigma^2$ and dv/dt. As an example, the processor 165 may use linear regression to determine a best-fit linear equation representing the data set 665, such as an equation of the form of the equation (4), as shown as a line 670. Then, from the line 670, the processor 165 may obtain a slope and intercept, which represent $\sigma_v^2$ and $\sigma_h^2$, respectively. The scattered plot 660 also includes another exemplary line 675 that is a result of linear regression of another example data set. Because the slope of the line 675 is less than the slope of the line 670, the processor 165 may determine that the signal used to create the line 675 may have a smaller horizontal jitter than the signal used to create the line 670. Because the intercept of line 675 is higher than the intercept of the line 670, the processor 165 may determine that the signal used to create the line 675 may have a higher vertical jitter than the signal used to create the line 670.

Although one embodiment of each of the methods 300, 400, 500 has been depicted, other embodiments may perform the steps in different sequence, or a modified arrangement to achieve the same primary function, which is to resolve jitter into horizontal and vertical components.

Although an exemplary signal measurement system 100 has been described with reference to FIG. 1, other implementations may be deployed in other test and/or measurement applications. For example, several of the components (e.g., DMA, memory, math co-processor) on the system 100 may be substantially integrated into one or more integrated circuit packages, ASICs, or modules to provide a digitizing and analysis system capable of determining horizontal and/or vertical components of jitter as described herein. In some examples, an output may include an absolute or relative measurement of horizontal and/or vertical jitter. The output may be in graphical, visual indicator, numeric, or pass/fail format based on a threshold. In some embodiments, the results may be sent for display on a display device.

In various embodiments, apparatus and associated systems, methods and computer program products may relate to measuring jitter to identify orthogonal jitter components. Moreover, components of jitter, such as random, deterministic, and components thereof, such as data dependent, inter-symbol interference, and/or periodic jitter, may be combined or separated using various mathematical and/or analytical tools (e.g., quadrature addition, quadrature addition, convolution, statistical analysis) familiar to those of ordinary skill in the art of jitter analysis.

In some embodiments, information about the horizontal or vertical intrinsic jitter may be identified. In some cases, the identified intrinsic jitter information may be used to determine signal jitter directly using quadrature subtraction. For example, after measuring total jitter, signal jitter may be directly determined by quadrature subtraction of the intrinsic jitter if intrinsic jitter and signal jitter are assumed to be substantially orthogonal and random (i.e., Gaussian distributed samples). As an example, if signal jitter is assumed to be primarily horizontal, and if intrinsic jitter is assumed to be primarily vertical, then quadrature subtraction of intrinsic jitter from measured total jitter may yield an estimate of the signal jitter. As another example, if signal jitter is assumed to be primarily vertical, and if intrinsic jitter is assumed to be primarily horizontal, then quadrature subtraction of intrinsic jitter from measured overall or composite jitter may yield an estimate of the signal jitter.

In various embodiments, the system 100 may output a graphical and/or numerical representation of the horizontal and/or vertical components of jitter. For example, the representation may be relative, such as a pie chart showing the relative percentages for the horizontal and vertical signal jitter components for the total signal jitter. In another example, absolute values for horizontal and/or vertical signal jitter may be sent for display on a user interface in graphical and/or numeric formats. Similar representations may be output to indicate the relative and absolute values of the horizontal and/or vertical components of the intrinsic jitter. In another example, the estimated components maybe output for display as a function of a specified bit error rate (BER), at one or more user-specified BERs, and/or one or more bandwidths of the channel in the DO 105. An automated acquisitions and corresponding computations may be performed at several different combinations of DO channel bandwidth and BER specifications. For example, horizontal and/or vertical jitter components may be plotted on contour plots as a function of DO channel bandwidth (which may be adjusted electronically using FIR or IIR filters) and as a function of BER.

An acquisition system may include a processor and associated first memory for storing acquired sample data and a second memory for storing executable instructions that cause the processor to perform operations to resolve components of jitter as described herein.

A jitter measurement apparatus, such as a digital oscilloscope, sampling scope, or digital storage oscilloscope, may be calibrated by providing a grounded input signal (or other stable voltage source on an input channel. Such an input configuration may be automatically configured using relays and/or semiconductor switches. While no signal is being measured, such as when the measurement system is being manufactured or re-calibrated, or during idle time, for example, a substantially jitter free or characterized jitter reference signal may be acquired to determine the components of the intrinsic jitter added by the channel and/or the digital oscilloscope itself. This information may be stored in a non-volatile memory (e.g., flash, disc drive) for use in better identifying components of jitter on an input signal being measured.

In some applications, the system may further determine random amplitude (noise) and/or random jitter. In some further applications, the system may also determine random and/or deterministic phase noise (i.e., horizontal jitter). For example, the system may have the capability to determine random jitter and separately determine data dependent jitter. Such information may be used or displayed in combination with determined information about the lumped horizontal and/or vertical.

Some embodiments further implement a fixed-normalization Q-Scale (sometimes including transition density), where the Q-Scale is an alternative scale for expressing cumulative distribution functions (CDF) or Symmetric Cumulative Distribution Function (SCDF) as a function of Q rather than as a function of BER as follows:

$$Q(BER) = CDF_{Gaussian}^{-1}(BER/2)$$

In some embodiments, a benefit of this vertical scaling for the CDF, is that for a normal Gaussian distribution the CDF appears as a triangle or pyramid. Some embodiments may provide for a "renormalization of the Q-Scale" through a linear modification of the definition (above), such that a "normalized Q-Scale":

$$Q_{norm}(BER) = CDF_{Gaussian}^{-1}(BER/(\rho_{norm} \cdot 2))$$

This may provide for, for example, a canonical coordinate system for viewing distributions consisting of multiple Gaussian contributors when the value of $\rho_{norm}$ is adapted to the distribution under analysis. In some embodiments, the definition of the "normalized Q-Scale" and the method of obtaining the normalization factor, $\rho_{norm}$, can be used to reveal the behavior of the extremes of the CDF($Q_{norm}$).

According to some examples of the method, a "normal" single Gaussian behaves linearly, and other more complex arrangements, including the "Dual Dirac" convolved with a single Gaussian, may behave linearly when an appropriate $\rho_{norm}$ factor is introduced. In an example, a normalization for which the Q-Scale representation of the CDF behaves linearly is $\rho_{norm} = \frac{1}{2}$. An exemplary embodiment of a method follows.

First, a set of elements to be fitted is formed with 3 values: a vertical (Q-Scale) value, a horizontal coordinate (for the case of jitter, time . . . but the method may be extended to vertical noise analysis, or other suitable variable), and an associated error. Statistically, the error of the input variable $\Sigma p_n$ is furnished as the square-root of the total population of observations (the same sum) contributing to the estimate (of CDF in the case). Upper and lower values of BER are obtained for these variations, and an error inversely proportional to the error is assigned to the data point.

The Q-Scale normalization factor is varied over a range of plausible values to determine the "best" fit to linear behavior.

Using this value to correctly scale the probability, an intercept (with $Q_{norm}$ (BER)=0) is obtained for both the right-hand-side and the left-hand-side of the CDF($Q_{norm}$(BER)). This value may be interpreted as the mean-value associated with the noise/jitter contributor with sigma equal to the reciprocal of the slope obtained from the best linear fit, and amplitude equal to the normalization factor.

Under the assumption of symmetric noise/jitter contributions, a single optimal normalization may be obtained and used. However, both extremes of the CDF can be treated independently, yielding strengths ($\rho_{norm}$) and sigmas (1/slope) to characterize the extremal behavior of each side of the CDF distribution.

The method of this example yields the nominal values of Dj($\delta\delta$) from an analysis of the largely populated portion of the observed distribution. The further refined value of Rj is obtained from the detailed behavior of the last extremal fraction of the distribution to thus manifest.

In an embodiment, the method may provide a simple and straightforward determination of an optimal Q-Scale normalization for a distribution under analysis. The method may, for example, reveal the dominant extreme (right and left) behavior of the distribution as Gaussian contributors with known mean(s) and (probabilistic) amplitude(s).

These estimates of contributors can be shown to be accurate and precise with respect to Monte Carlo generated statistical distributions. In some examples, complex distributions may yield an effective Gaussian distribution with reduced "strength" indicated by the ideal $\rho_{norm}$ found as a result of this method.

In an example, a normalization value may be found by obtaining the value of rho for which the "best" or lowest ChiSquare over the largest populated region, not depassing Q=0, is produced. Varying the normalization factor from 1 to epsilon may obtain for the large percentile, large population "fit" a chisquare that reflects the "quality" of the fit. Other figures of merit could be used, with similar results, such as the maximum absolute error divided by the error associated with the data point, or a value proportional to the weight associated with the point contributing largest error, for example.

Once the observed CDF(Q) and Symmetric CDF (SCDF) have been obtained, a scan over plausible values of $\rho_{norm}$ are scanned (e.g., using a linear, binary, or golden section search), to obtain a "best" fit for the right hand-side and a best fit for the left-hand side (or alternatively a best overall fit). Then, the magnitude, sigma, and offset/mean associated with the dominant contributor to the right and left sides of the distribution's behavior may be predicted.

Exemplary methods that may be performed in various embodiments will next be described with reference generally to FIGS. 7-11.

An exemplary method for Repeating Pattern Jitter Measurements is as follows.

Input Signal

The received input signal may be non-return to zero (NRZ) two-level (i.e., binary) data streams with a repeating data pattern and a synchronous clock. The method may be performed without knowing the pattern in advance of receiving it. In some examples, the clock may be scaled down by a divider to a reduced clock rate using, for example, a prescaler. In an example, the input signal may be received by a suitably modified digital oscilloscope.

Acquisition and Setup

Jitter measurements can either be configured manually before enabling the jitter measurement, or set semi-automatically using the "Check Scope Setup" button. In one example, the oscilloscope may be configured in CIS acquisition mode and the correct synchronization signal specified in the trigger dialog. Settings for CIS acquisition may include PLL Bandwidth "High" and Samples per UI=1024 or 2048. A digital oscilloscope time base may be set to a minimum (10 divisions) which allows for more than 2 repetitions of the repeating pattern.

If the total number of points acquired in order to meet the above requirement is less than 1M points, then the time base setting may be increased to have around 1M to improve efficiency.

Obtaining DDj or Edge Displacement Measurement

Signal Average of Substantially an Entire Data Pattern

The input signal under test may be "signal averaged" for up to 10,000 sweeps, for example.

Pattern Detection

The processor responsible for the edge displacement calculation may also be responsible for detecting and recording the repeating pattern of data. In some systems, this calculation is performed on the averaged waveform. A signal with a large Pj, ISI, and/or vertical noise may be referred to as a signal with a "highly stressed" eye. Detecting correct bit patterns in a signal with a highly stressed eye may call for use of a robust algorithm.

In this example, CIS acquisition provides a lock to the pattern, allowing an average response to be formed, even without having detected the pattern. The pattern detection may involve learning a reasonable threshold (approximating 50% of the signals vertical span) and, using some (smallish) hysteresis, identifying transitions in the sequence of data.

Edge Displacement Analysis

Once the edges have been detected as described above, the classical method used for real-time oscilloscopes is applied. This consists of the following steps. A first step involves detecting all edges in the data sequence. A second step involves determining the bit values (the precise NRZ decode) in the input waveform. A third step involves synchronizing to the data pattern requested (or found). A fourth step involves comparing a time from a first edge to a subsequent edge in the pattern, and calculating $\Delta t_n = (t_n - t_0) - M \cdot \tau$. There are typically fewer edge displacement values than UI's in the repeating pattern length).

Distribution as Well as pk-pk Value as "DDj"

The edge displacement values may be used in three ways. First, the peak to peak variation is reported as DDj (Data Dependent Jitter). Second, the distribution is displayed as the DDj histogram (since the effect of this distribution on Tj is typically not a simple addition. Third, the distribution of values is used to create the system's constructed PDF for final estimation of Tj(BER) or Tj(Q).

Obtaining Non-DDj Jitter Measurement

In some applications, the above procedure may effectively remove inter symbol interference (ISI) effects and provide for evaluating the remaining jitter for the individual edge transitions, possibly independently from the edge displacement problem. However, in some applications, there may be a remaining effect to account for to improve the precision of jitter measurements in the presence of large ISI. Even though the edge displacements of offsets between the distributions contributed by each edge in the pattern sequence are "removed", the fact that the various bit transitions have different histories means they also have different rise times or more generally different trajectories while crossing the threshold level. This means that ISI has produced different trajectories and these trajectories translate the vertical noise sensitivity of an equivalent receiver or the receiver under test onto different Rj distributions.

This procedure may be run in parallel to collect a very large database of persistence data for as much as possible of the repeating pattern. In one example, maximum memory consumption may be limited to about 128 Mbytes of DRAM. Up to 31 UIs, at 2048 columns per UI, may be used. Other examples may measure over a larger number of edges using perhaps lower horizontal resolution, or conversely using more memory. The method is described next.

"Wide" Persistence Accumulation of CIS Recorded Data

An intensive aspect of this process is collection of many large CIS acquisitions and re-organizing them into a wide persistence map. This map can be as wide as 65k, and may be, for example a power of two in overall width. In order to limit the overall consumption of memory resources, the maximum number of UIs which are recorded from the acquisition may be limited, in some embodiments, to 32 UI's with 2048 columns of persistence data.

Composite Histogram (from Persistence) as Non-DDj Jitter Distribution

Analyzing the 2-dimensional "PMap" the algorithm proceeds by scanning all vertical columns to determine where the edges occur by finding where the distributions are contributing to the vertical band (crossing zone). Once these zones are determined, then a composite histogram is formed for each such zone. Then over all detected edges the histograms for the different edges are also combined to provide a single histogram for analysis. The foregoing may be summarized as follows:

a. Edge detection and locating the Zones of Interest
b. Assembly of multiply histograms from all of the slices of the Zone of interest into a single histogram (see, e.g., FIG. 7), by superposing the histograms at their respective mean horizontal coordinate.
c. The histograms for each "edge" are combined to form a single histogram.

Analysis of Symmetric CDF "On the Q-Scale"

An exemplary Q-Scale analysis process is next described.

Obtain the CDF through integration of the approximate or observed PDF (i.e., the single histogram from the previous procedure), first from left to right, then for each element following the median (first bin to exceed 0.50 of the total population or total sum), replace these values with the total population—previous summed value. This yields the Symmetric Cumulative Distribution function or SCDF.

Translate to the Q-Scale and the Q-Scale "Normalization" of each probability associated with each "bin" or coordinate in the SCDF. The Q value to associate with this probability is:

$$Q(p) = CDF_G^{-1}\left(\frac{p}{2 \cdot p_{norm}}\right)$$

Determine data values included in the fit by using the minimum of: a specified max number of points and a maximum percentage of the total population. In one example, these limits may be 10k points and 2% of the total population. In that example, a maximum of 10 k points or bins in each extreme are used to meet this requirement. The 2% limit assures that even for a distribution of a couple of thousand events total population there is nonetheless some data to fit. One additional constraint is added, that values of Q<0 (or p>0.5) are excluded from the fit.

In some embodiments, linear fitting and error-based Q-value weighting may be performed using the two independent data sets from the right and left of the analyzed SCDF(Q)

distribution. This fitting may be standard weighted linear regression. For weights, since no numerical solution to the inverse CDF exists, we use a numerical value calculated as such:

$$1/\Delta_i = 1 \bigg/ \left( \begin{array}{c} (Q((N_i + \sqrt{N_i})/N_{total}) - \\ (Q((N_i - \sqrt{N_i})/N_{total}) \end{array} \right)$$

a. Taking special care to avoid the Q(p<0) case by substituting $$1/\Delta_i = 1/(2Q((N_i+\sqrt{N_i})/N_{total}) \tag{0.1}$$

Automatic determination of optimal "normalization" may be performed based on experience and observation. For example, to assure the best match to linear behavior, the max number of points may be set to 100M and the percentage to 45% (internally). In some examples, this may assure that a large portion of the shoulders is used for the fit.

A series of fits are performed over a range of $\rho_{norm}$ from 1.0 to 0.020 in equal steps. The fits are performed on both sides of the SCDF distributions. For each normalization setting, the sum of the left and right chi squares (weighted) is recorded. The natural normalization of this dataset is then (to within the step size) the one with the lowest cumulative chi square.

In some embodiments, a constraint Dj>=0 may be provided to reduce user confusion. Other constraints may be applied, further reducing the $\rho_{norm}$ in small steps until the condition $\rho_{norm}$>=0 is met.

Rj(δδ) and Dj(δδ) may be determined from two linear fits. Rj(δδ) is given by the average of the left and right reciprocal slopes. Each fit on Q-Scale gives a sigma value, which is the reciprocal of the absolute value of the fitted slope on Q-Scale.

$$Rj(\delta\delta)=\sigma=0.5/|slope(CDF_L^{-1}(Q)|+0.5/|slope(CDF_R^{-1}(Q)|$$

$$Dj(\delta\delta)=CDF_R^{-1}(Q=0)-CDF_L^{-1}(Q=0)$$

In some cases, Dj(δδ) may less than or equal to zero. For some cumulative distributions observed on the Q-Scale, the intersections of the lines with Q=0 are negative.

Convolution of Predicted PDF with DDj Histogram to Yield Total Jitter

An exemplary embodiment further includes the following:

One very wide PDF may be formed by using the central regions (non-fitted) of the original distribution, and extrapolating its tails using a Gaussian of the prescribed mean and sigma on each of the right and left sides.

The edge displacements (from above) are recorded as a list of offsets.

Using the difference from the mean offset, for each offset a copy of the extrapolated distribution is summed into one substantially large histogram. This is the "convolved" PDF. The CDF is obtained by integrating this PDF from the left to the right. The CDF is translated into a SCDF by treating all bins to the right of the median value, all CDF values to be the result of the subtraction of half the total population from the CDF values (or alternatively obtaining the SCDF by summing from the left and then from the right, independently).

Transition density and the level for the Tj calculation at a given BER are calculated from the final composite SCDF as it's width at BER/(2$\rho_{tx}$).

Figure 12:
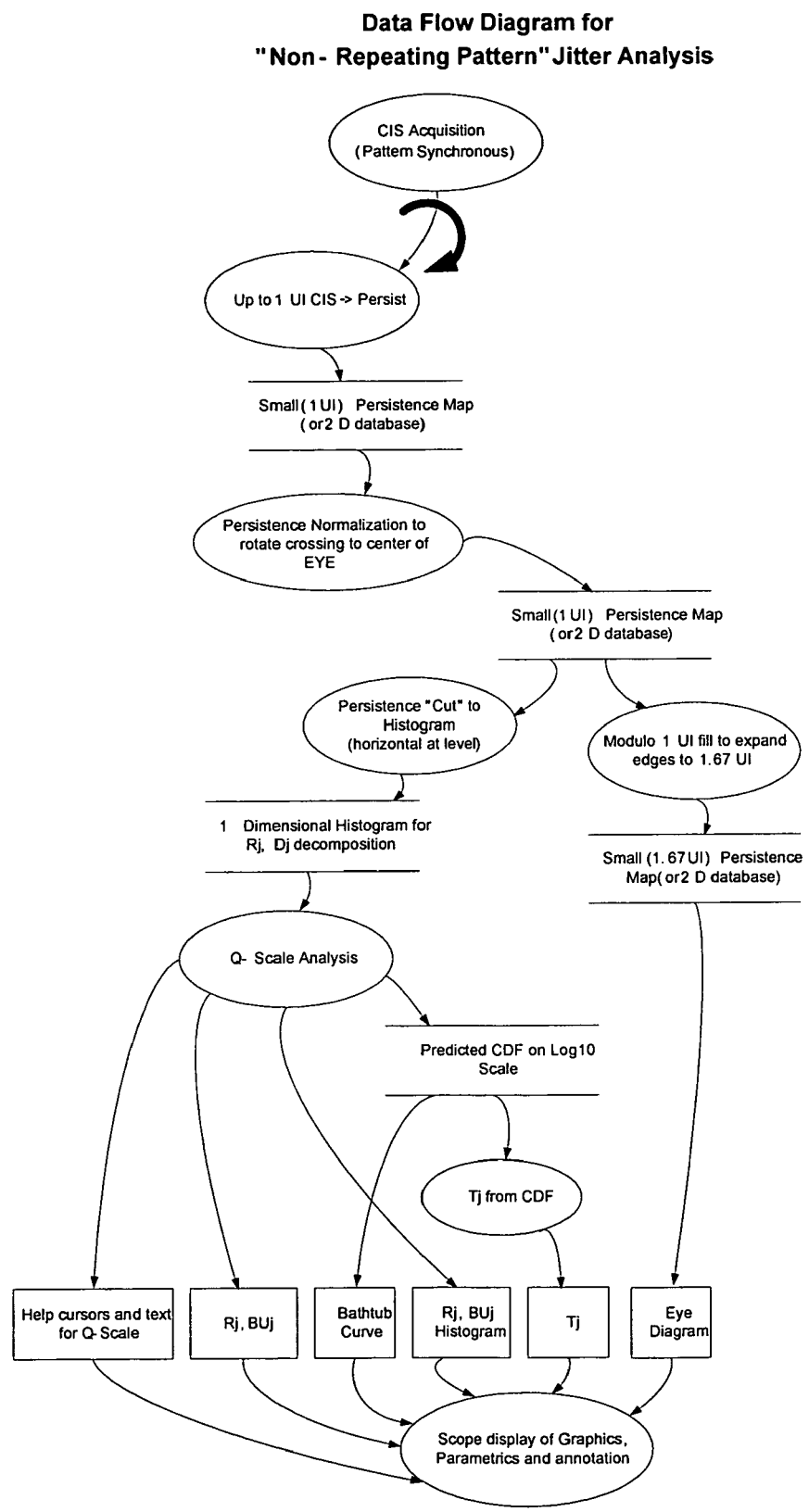
FIGS. 12-13 illustrate an exemplary method for jitter analysis of signals with non-repeating patterns.
Figure 13:
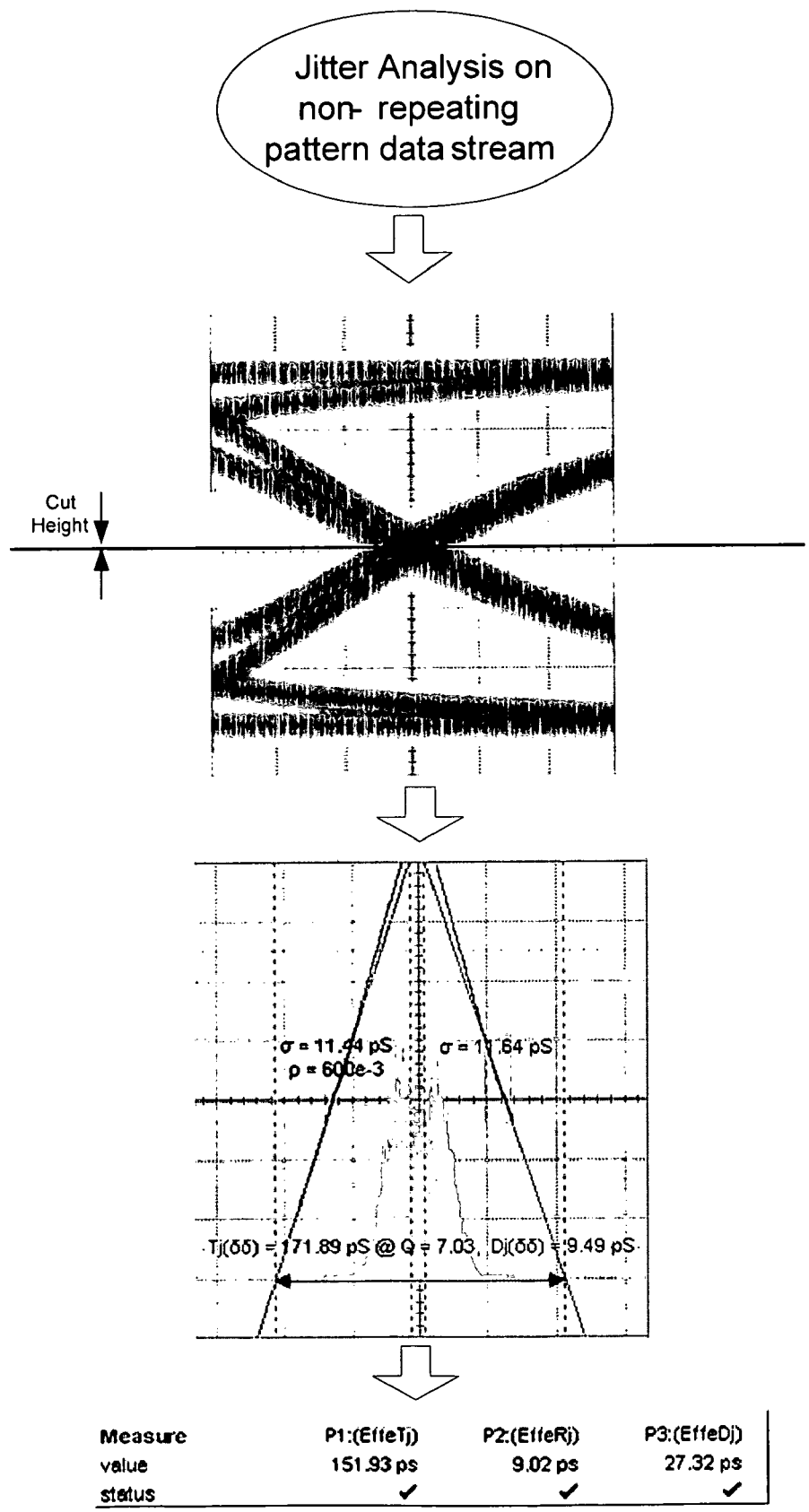

An exemplary method for Non-repeating pattern jitter measurements is as follows and generally with reference to FIGS. 12-13.

Input Signal

In general, this method applies to signals that are a non-return to zero (NRZ) data stream of nearly constant rate, with a synchronous signal (clock) applied to the trigger or prescaler input of the oscilloscope.

Acquisition and Setup

Jitter measurements can either be configured manually before enabling the jitter measurement, or set semi-automatically using the "Check Scope Setup" button. In one example, the oscilloscope may be configured in CIS acquisition mode. Settings for CIS acquisition may include PLL Bandwidth "High" and Samples per UI=1024 or 2048. A timebase may be set to a minimum (10 divisions) which allows for more than 2 repetitions of the repeating pattern. If the total number of points acquired in order to meet the above requirement is less than 1M points, then the timebase setting may be increased to have around 1M to improve efficiency.

Obtaining Overall Jitter Measurement

This kind of jitter measurement does not observe timing errors associated with particular positions in a sequence of a pattern, because, nominally "there is no repeating pattern." The analysis works directly from the eye diagram (where all bits are treated equally) and from the shape of the eye diagram deduces the Tj, Rj and Dj associated with the observed eye-diagram. As used in this example, "shape" of the eye diagram refers to the detail of the persistence database associated with the eye-diagram.

"Eye" Persistence Accumulation of CIS Recorded Data

Even though the pattern is not repeating, the UI's or unit intervals are repeating and cycling through whatever states the signal stream is passing. As such, the CIS acquisition data can be used directly to populate a persistence map representing exactly one unit interval. The horizontal coordinate of every sample in the CIS record is used (modulo τ where τ is the duration of the bit interval, or the period of the bit clock) to populate a "smallish" 2D persistence map or 2D database. This modulo procedure may be done without any assumptions concerning the detailed (sub 1 UI) phase of the signal, which is fixed but unknown.

The accumulated eye (as described in the previous step) is then analyzed for periodicity in total population in the central (vertical) zone. An exemplary procedure uses the central 20% of the vertically populated region for the overall eye diagram. Fourier Analysis (e.g., FFT) may be used to analyze the density function vs. horizontal column position to ascertain the phase of the maximum magnitude element. Some examples may accommodate an efficient complex FFT by selecting the number of columns to be a power of 2 (e.g., 1024 columns). This phase and knowledge of how many UI's are assumed to be in the persistence map (always 1 UI in this case) are used to learn the rotation in the columns needed to center either the crossing point of the eye or the opening of the eye.

In some embodiments, the analysis may determine the correct amount to rotate the persistence map, so that the crossing region is precisely centered in the horizontal coordinate.

Slice the Eye to Obtain the Histogram of Overall Jitter

Using a vertical "height" specified on the first Jitter Dialog, a slice is taken from the persistence data to form a 1-D histogram of the overall "jitter."

Analysis of CDF "On the Q-Scale"

Using a procedure similar to that described above with respect to repeating patterns, the histogram may transformed into a CDF and then an SCDF, and the vertical coordinates for each horizontal coordinate may be translated to the Q-Scale.

Effective Decomposition of Jitter

Rj and Dj results may be directly determined from Q-Scale analysis, as the entire distribution has been analyzed.

The measured transition density and a specified BER may be used to calculate the Tj values (at the specified BER level) from the SCDF output of the Q-Scale Analysis.

Figure 14:
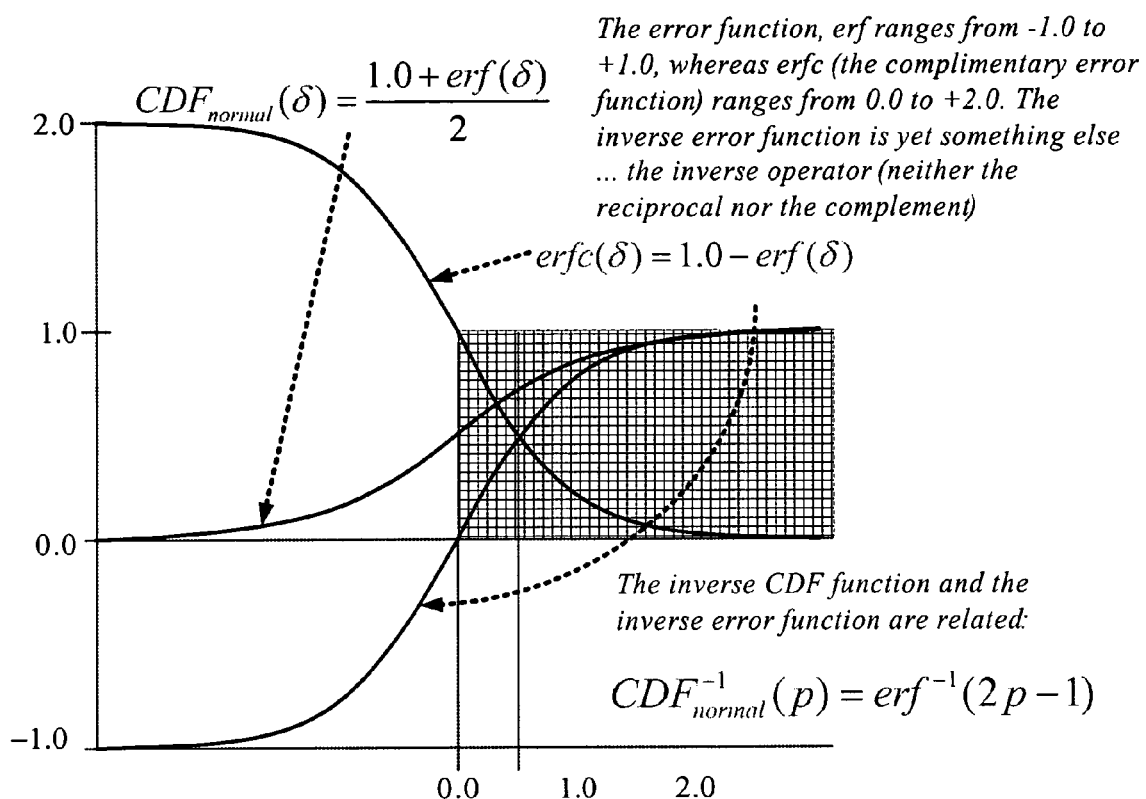
FIGS. 14-18B illustrate exemplary applications of Q-scale plots.

As indicated in FIG. 14, the Cumulative Distribution Function (CDF) for a normal Gaussian is related to the error function as follows.

$$CDF(x) = \frac{1 - erf(x)}{2}$$

The CDF being the function which provides the probability for an event (for a system obeying a Gaussian probability density function) occurring to the left of the value x.

Note also, by inspection:

$$CDF^{-1}(p) = erf^{-1}(2p-1)$$

Where the (−1) exponent denotes "inverse" operator. That is, the inverse CDF is the function that gives a displacement (in sigmas) from the mean, for which the probability to the left of said displacement is the input variable, p.

The complementary error function is not the inverse error function, $erf^{-1}(p)$. If p is the evaluation of the error function for a displacement x, then the inverse error function of x with evaluate to p.

The heuristic jitter equation is linearly related to this inverse error function.

$$Tj(BER) = Dj + \alpha(BER) \cdot Rj$$

where the function $\alpha(BER)$ is the number of standard deviations for a Gaussian with sigma of 1, which corresponds to the specified bit error ratio (BER). In various implementations, $\alpha(BER)$ may be within a constant factor, exactly the inverse error function, $erf^{-1}(1-BER)$. That is:

$$\alpha(BER) = 2 \cdot \left| CDF_{Gausiian}^{-1}\left(\frac{BER}{2\rho_{tx}}\right) \right|$$

or $$\alpha(BER) = 2 \cdot \left| erf^{-1}\left(\frac{BER}{\rho_{tx}} - 1\right) \right|$$

In both cases, various embodiments may incorporate the transition density. The alpha factor may be used to calculate Tj.

In various embodiments, the Q-Scale may be used to view a cumulative probability function. A Gaussian distributed histogram which has been transformed into a SCDF and plotted on a Q-Scale appears as a triangular function, with the apex of the triangle converging at Q=0 at a point, and with equal slopes on each side, the reciprocal of the slope being the sigma of the Gaussian distribution. That may provide an insightful representation, in part because the human eye discriminates between "linear vs. non-linear" data sets. Furthermore, linear relationships may be easier to intuitively extrapolate and/or interpolate.

The Q-Scale may be useful for analyzing vertical noise distributions, which are governed by many similar physical mechanisms. For example, Q-scale may provide a useful tool for BER prediction for some optical signals in which vertical noise dominates horizontal noise.

Jitter measurements may display the SCDF on a $\log_{10}$ (BER) scale using a bathtub curve, which may be used to convey the nature of the SCDF on a logarithmic scale to represent the confidence interval for an observed distribution as a function of the $\log_{10}$ of BER, where the confidence level is $C_L = 1.0 - BER$.

In accordance with the some embodiments, a system may first calculate the measured SCDF, and then plot the cumulative probabilities on a Q-Scale to reveal Gaussian distributions to be straight lines.

Figure 15:
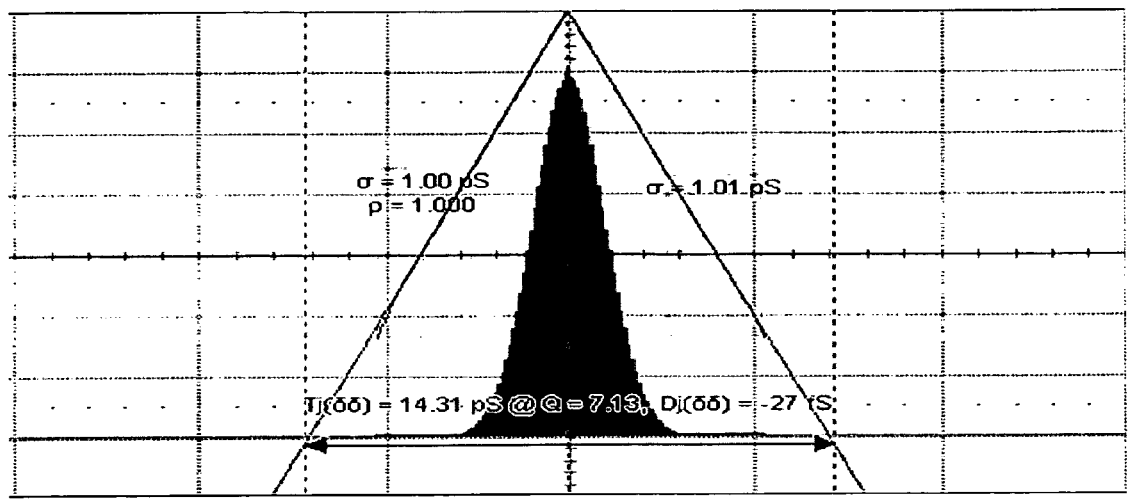
Figure 15:
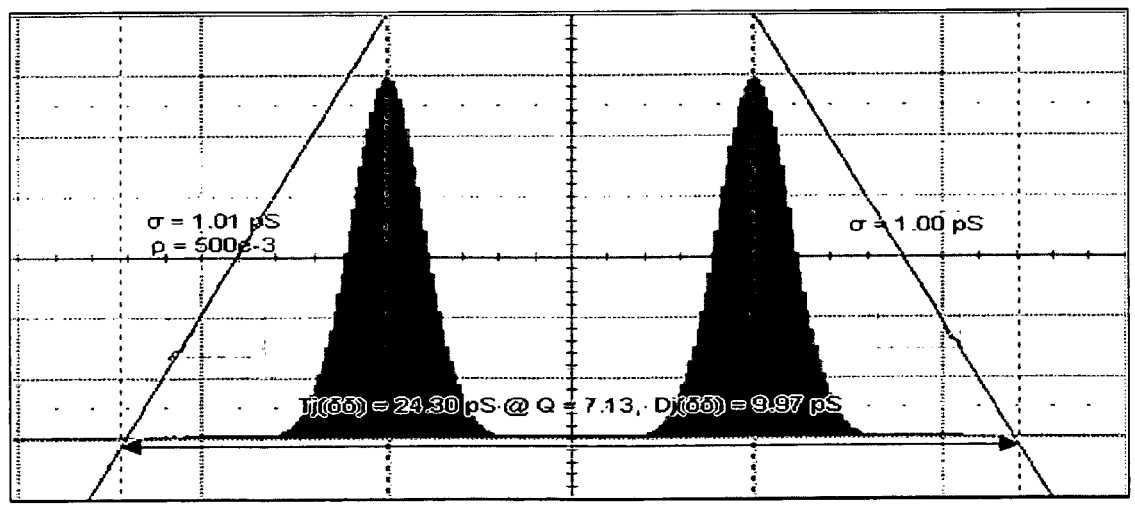

FIG. 15A shows an example plot that represents a single Normal (modeled Gaussian with 1 ps sigma) SCDF shown on Q-Scale. The total area of the distributions PDF is 1.0. FIG. 15B shows an example plot representing represents a Dual-Dirac Normal Distribution. The total area of the distributions PDF is 1.0. In this example, the curved actual Q-Scale SCDF is not quite behaving linearly near Q=0 (top of screen). It's only at a Q of around 2 that the distribution appears to start behaving like a Gaussian.

Q-Scale normalization may be applied in some embodiments to allow for an additional factor for our Q-scale analysis. Some embodiments permit a normalization factor such that Q represents a probability (as did BER) but with an additional implicit linear factor. For what is referred to herein as a Q-Scale normalization of 0.5, a Gaussian with area (or total probability of 0.5) behaves linearly on the Q-Scale. Since the most simplified Dual-Dirac model for jitter consists of two area=½ Gaussians separated by some Dj (Dj=$\mu_R - \mu_L$). Each Gaussian may be assumed to have the same characteristic sigma or Rj (where Rj=$\sigma_L = \sigma_R = \sigma$). Plotted with a Q-Scale normalization of ½, each of the Gaussians may have an equivalent area of 1.0, and so behave linearly.

Figure 16:
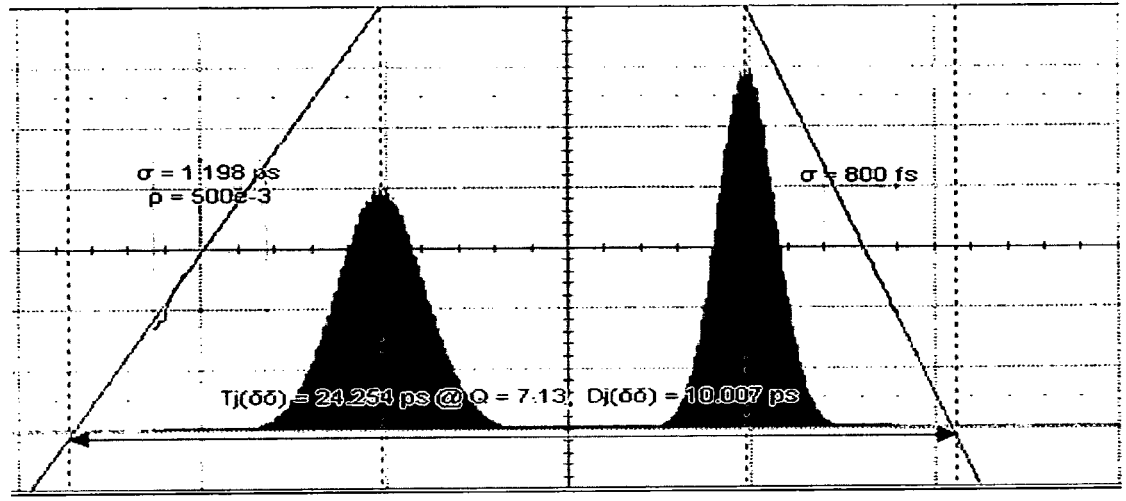
Figure 16:
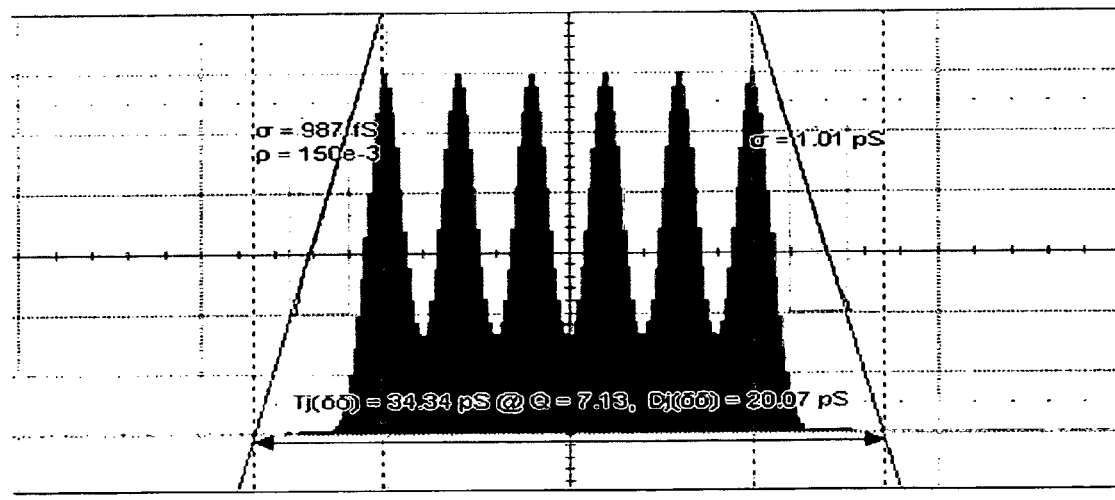

In some examples, the Q-Scale normalization may cause the Gaussian of area equal to the normalization factor to behave linearly. This it does independently of the sigma. In the example of FIG. 16A, the left-side Gaussian has a modeled sigma of 1.2 ps, whereas the right hand distribution, only 0.80 ps. FIG. 16A shows an example plot of a Dual-Dirac (modeled/simulated distribution with equal amplitude $\sigma_L$=1.2 ps, $\sigma_R$=0.8 ps, Dj=10 ps) with a Q-scale normalization of ρ=0.50 that exhibits linear behavior for both distribution extremes (right and left), and yields the correct values for the means and the sigmas.

In FIG. 16B, an exemplary plot of a (6×) Hexa-Dirac distribution, viewed with a Q-Scale normalization of about ⅙, exhibits very linear behavior on both sides. It also yields the correct sigma and Dj(δδ). At a Q-Scale normalization of 1.0, the wrong answers would appear.

Figure 17A:
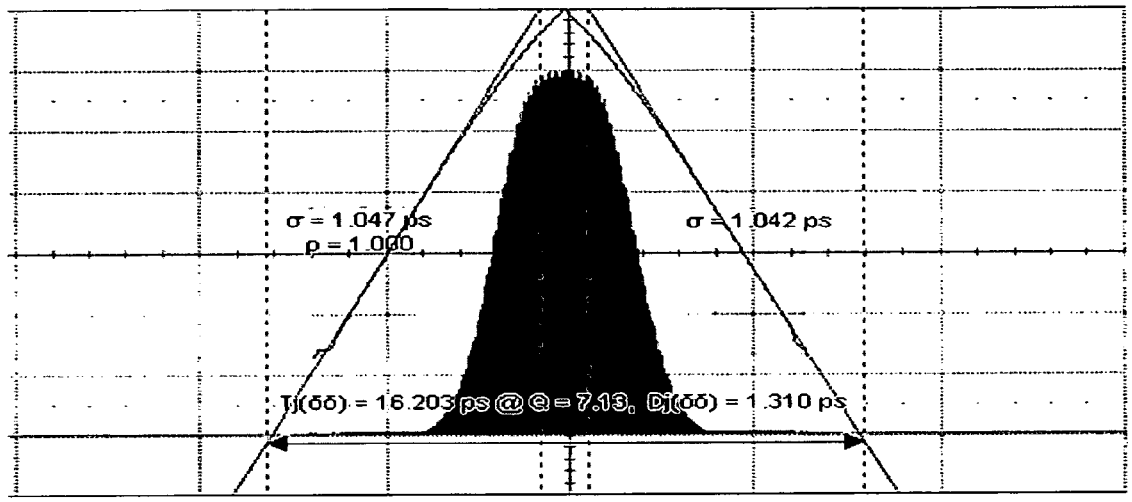

Or take this case where $\sigma_L = \sigma_R$=1.0 ps, Dj=2 ps, as illustrated in an exemplary plot in FIG. 17A, where the Q-Scale normalization factor set to one. The plot does not appear to show a Dual-Dirac. But when the Q-Scale normalization is adjusted to show linear behavior of the extremes, it is evident that the amplitude of the Gaussians contributing to the tails is ½. While the Q-Scale normalization is set to 1.0 as below, the reported result is Dj(δδ)=1.31 ps instead of 2 ps.

Figure 17B:
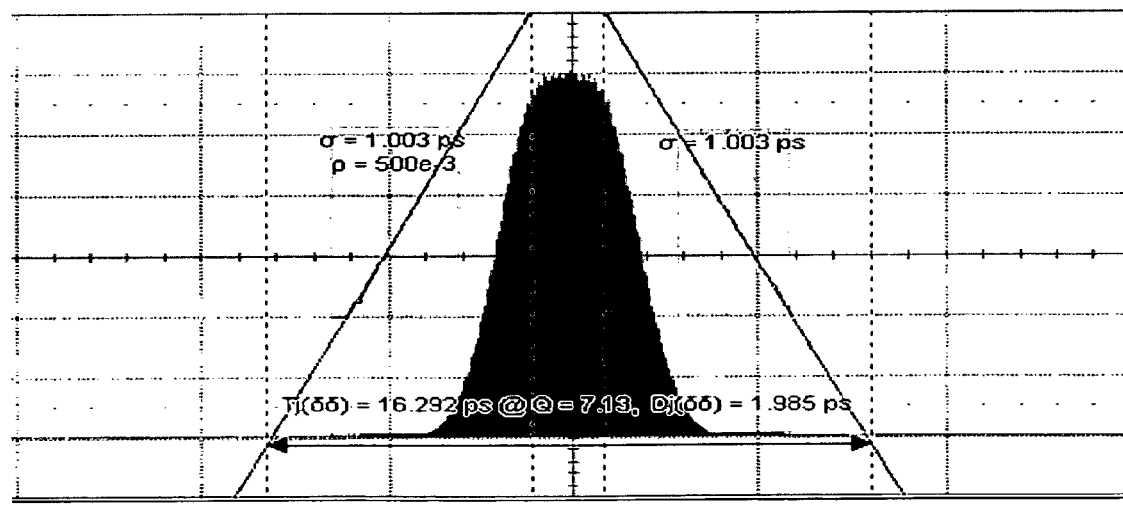

Or take this case where $\sigma_L = \sigma_R$=1.0 ps, Dj=2 ps, as illustrated in an exemplary plot in FIG. 17B, but the Q-Scale normalization factor set to one-half. When the Q-Scale normalization is set to ½, the reported Dj(δδ) is correct as well as the reported sigmas. (correct in the sense that it matches precisely the modeled variables for sigma and the separation between the delta-functions).

The usual equation for Q as a function of BER is:

$$Q(BER) = CDF^{-1}\left(\frac{BER}{2}\right)$$

If instead, the Q-Scale normalization is incorporated, it's as though the probabilities by the reciprocal of the factor $\rho_{norm}$ have been increased as follows:

$$Q(BER) = CDF^{-1}\left(\frac{BER}{2\rho_{norm}}\right)$$

In another example, the Q-Scale normalization can correctly identify the Dj(δδ) and underlying σ contributing to the observed distribution for a PDF of a sinusoidal function.

Figure 18A:
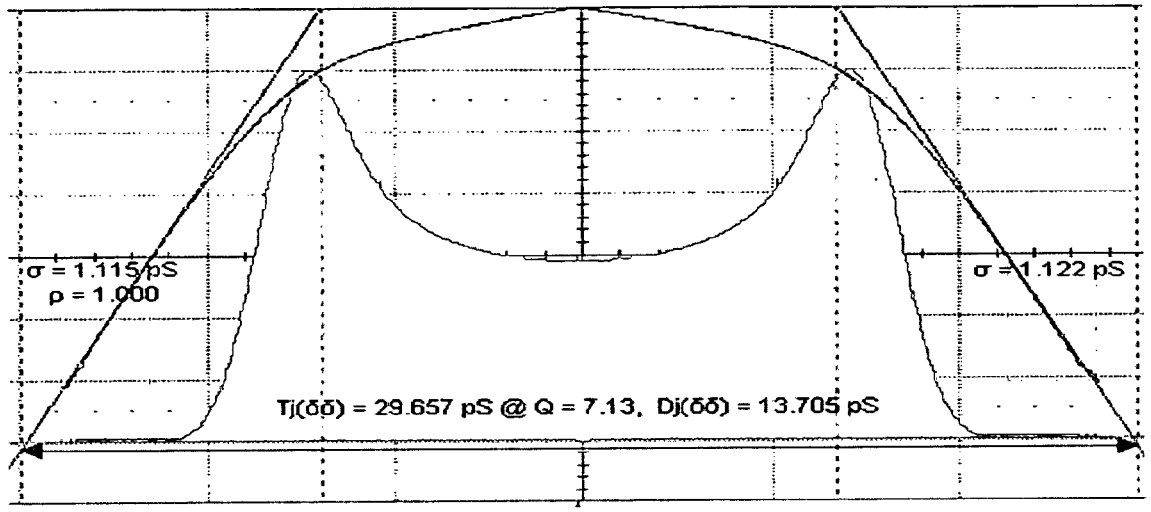

FIG. 18A shows an exemplary un-normalized Q-Scale plot for the PDF of a sinusoid with peak-to-peak amplitude 16 ps convolved (Monte-Carlo) with a 1 ps Gaussian, displays non-linear extremal behavior although asymptotically linear (large Q).

Figure 18B:
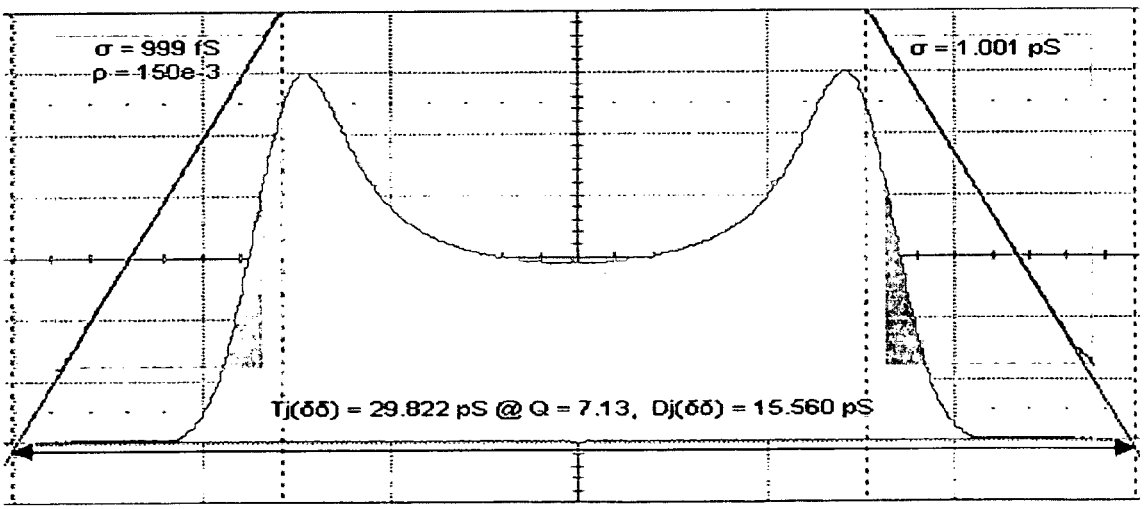

Using automatic Q-Scale normalization, as shown in the exemplary plot in FIG. 18B, the substantially correct details of the underlying probabilities are evident. The error (440 fs) might be attributed, at least in part, to factors (e.g., the Monte Carlo analysis) other than the Q-Scale analysis.

Calculation of the inverse CDF for a Gaussian distribution may be performed in various embodiments using supplied by most sophisticated packages such as MathCad, Mathmatica, MATLAB, etc.

A direct calculation may be carried out in some programming languages such as C, C++, for example, that can be programmed to calculate to achieve some numerical approximation. Optionally, it may also be calculated by performing the numerical integration of the normalized Gaussian (in the case of the $CDF_G^{-1}(p)$). The (forward) error function and the $CDF_G(x)$ are readily available in some commercially available math packages and libraries. Direct calculation using C++ may be based on an algorithm.

CDF refers to a Cumulative Distribution Function (for any distribution) which in the preferred embodiment is:

$$CDF(x) = \int_{-\infty}^{x} PDF(u) du$$

CDF of Gaussian refers to a Cumulative Distribution for a Gaussian Distribution (i.e. where the PDF(x) is a Gaussian function), which in the preferred embodiment is:

$$CDF_{Gaussian}(x) = \frac{1 - erf(x)}{2}$$

The Probability Distribution Function, sometimes written ρ(x), for a Gaussian behaved phenomenon is in the preferred embodiment:

$$PDF_{Gaussian}(x) = \rho_{Gaussian}(x) = \frac{w}{\sigma\sqrt{2\pi}} e^{-\frac{(x-\mu)^2}{2\sigma^2}}$$

Where μ is the distribution's mean, σ is the characteristic sigma, and w is the overall probability. When w=1, the distribution is said to be normal.

SCDF refers to a Symmetric Cumulative Distribution Function, which grows monotonically from 0 to 0.5 and rather than growing larger than 0.5, diminishes monotonically back down to zero.

Inverse CDF may refer to $CDF^{-1}(p)$, which gives the coordinate x, for which the probability governed by a Gaussian distribution of an event occurring to the left of that coordinate is p.

Q-scale may refer to an alternative vertical scale to BER or Log10(BER), where:

$$Q(BER) = CDF_{Gaussian}^{-1}(BER/2)$$

or alternatively for a "normalized Q-Scale"

$$Q(BER) = CDF_{Gaussian}^{-1}(BER/(\rho_{norm} \cdot 2)).$$

An exemplary histogram may refer to a series of populations associated with (usually) adjacent horizontal intervals of equal size, and may also be referred to as a frequency of occurrence graph. A histogram is typically formed from a series of measurements or observations, by "binning" those values (of the measurement or observation) into bins or intervals of the histogram.

An observed or measured distribution may include a histogram with some number of bins, some bin width or interval, and a coordinate associated (usually with the left edge) of the first or leftmost bin.

An Error Function, or erf( ), is the "Error Function" is, in the preferred embodiment, defined as:

$$erf(x) = \frac{2}{\sqrt{\pi}} \int_{-\infty}^{x} e^{-u^2} du$$

In the preferred embodiment, the error function is a mathematical function closely related to the cumulative distribution function for a Gaussian, and is defined as:

$$1 - 2CDF_{Gaussian}(x) = erf(x).$$

A Complementary Error Function is, in the preferred embodiment, defined as:

$$erfc(x) \equiv 1 - erf(x)$$

or $$erfc(x) = \frac{2}{\sqrt{\pi}} \int_{x}^{\infty} e^{-u^2} du.$$

An inverse Error Function may refer to $erf^{-1}(x)$, which is the inverse of the error function. Whereas the error function gives a value related to the probability of an event occurring to the left of x, for a given probability, p, the inverse error function gives (as a value related to) the probability of an event occurring to the left of a horizontal coordinate, when only the coordinate is specified.

Rj or RJ may refer to "Random jitter," which may include random Gaussian unbounded jitter, or the part of jitter that grows with decreasing BER Dj or DJ may refer to "Deterministic jitter," or bounded jitter. In the preferred embodiment, DJ includes, for example, periodic jitter and data dependant jitter.

Tj or TJ may refer to "Total jitter," where the word total may refer to an expected value of the observed peak-to-peak timing for a specified number of observations. In general, Tj may be qualified by a specified (or assumed transition density) and a Bit Error Ratio (BER).

Transition Density may refer to $\rho_{tx}$ is the ratio of edges to UI's for a given data stream or sometimes for a given test data pattern. The transition density affects the calculation of Total jitter. Typical data streams have a transition density in the neighborhood of 0.5.

A Prescaler is in the preferred embodiment an electronic circuit which synchronously divides down a clock by some factor N.

Suitable processors for the execution of a program of instructions include, by way of example, both general and special purpose microprocessors, which may include a single processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including, by way of example, semiconductor memory devices, such as EPROM, EEPROM, and flash memory devices; magnetic disks, such as internal hard disks and removable disks; magneto-optical disks; and, CD-ROM and DVD-ROM disks. The processor and the memory can be supplemented by, or incorporated in, ASICs (application-specific integrated circuits).

In some implementations, one or more user-interface features may be custom configured to perform specific functions. Various embodiments may be implemented in a computer system that includes a graphical user interface and/or an Internet browser. To provide for interaction with a user, some implementations may be implemented on a computer having a display device, such as a CRT (cathode ray tube) or LCD (liquid crystal display) monitor for displaying information to the user, a keyboard, and a pointing device, such as a mouse or a trackball by which the user can provide input to the computer.

In various embodiments, the system 100 may communicate using suitable communication methods, equipment, and techniques. For example, the system 100 may communicate with a portable computer, network server, or other device using point-to-point communication in which a message is transported directly from the source to the receiver over a dedicated physical link (e.g., fiber optic link, point-to-point wiring, and daisy-chain). Other embodiments may transport messages by broadcasting to all or substantially all devices that are coupled together by a communication network, for example, by using omni-directional radio frequency (RF) signals, while still other embodiments may transport messages characterized by high directivity, such as RF signals transmitted using directional (i.e., narrow beam) antennas or infrared signals that may optionally be used with focusing optics. Still other embodiments are possible using appropriate interfaces and protocols such as, by way of example and not intended to be limiting, RS-232, RS-422, RS-485, 802.11a/b/g, Wi-Fi, Ethernet, IrDA, FDDI (fiber distributed data interface), token-ring networks, or multiplexing techniques based on frequency, time, or code division. Some implementations may optionally incorporate features such as error checking and correction (ECC) for data integrity, or security measures, such as encryption (e.g., WEP) and password protection.

In some embodiments, each memory may be programmed with the same information and be initialized with substantially identical information stored in non-volatile memory. In other embodiments, one or more systems 100 may be custom configured to perform specific functions. For example, one system 100 may be calibrated for use to identify intrinsic jitter during production of other systems.

A number of embodiments of the invention have been described. Nevertheless, it will be understood that various modifications may be made without departing from the spirit and scope of the invention. For example, advantageous results may be achieved if the steps of the disclosed techniques were performed in a different sequence, if components in the disclosed systems were combined in a different manner, or if the components were replaced or supplemented by other components. The functions and processes (including algorithms) may be performed in hardware, software, or a combination thereof. Accordingly, other embodiments are within the scope of the following claims.

What is claimed is:

1. A digital oscilloscope comprising:
   a channel to receive a non-return-to-zero digital signal having a repeating pattern that includes a sequence of transitions, said signal having jitter;
   an acquisition module to acquire a plurality of digital samples of the signal over a plurality of occurrences of said repeating pattern;
   a processor;
   a first plurality of memory locations to store the acquired samples; and
   a second plurality of memory locations coupled to the processor to store executable instructions that, when executed by the processor, cause operations to be performed on the digital samples stored in the first plurality of memory locations to resolve the jitter into a plurality of components, said operations comprising:
      i) determining at least one horizontal component that corresponds to a time domain error of said jitter;
      ii) determining at least one vertical component that corresponds to an amplitude error of said jitter, said vertical component being distinct from said horizontal component;
      iii) identifying an amount of intrinsic jitter added by the channel; and
      iv) determining a signal jitter by quadrature subtraction of the intrinsic jitter from a measured total jitter.

2. The apparatus of claim 1, said operations further comprising determining a total signal jitter.

3. The apparatus of claim 2, wherein the total signal jitter consists essentially of a horizontal component and a vertical component.

4. The apparatus of claim 1, wherein said operations further comprise identifying a single vertical component of said jitter.

5. The apparatus of claim 1, wherein said signal is periodic.

6. The apparatus of claim 1, wherein the signal jitter corresponds substantially to horizontal jitter and the intrinsic jitter corresponds substantially to vertical jitter.

7. The apparatus of claim 6, wherein the intrinsic jitter comprises thermal noise.

8. The apparatus of claim 1, wherein said operations further comprise generating an eye diagram from the sampled patterns.

9. The apparatus of claim 1, wherein said operations further comprise generating a probability distribution function upon processing the digital samples.

10. The apparatus of claim 1, wherein said operations further comprise fitting a curve to the acquired samples.

11. The apparatus of claim 10, wherein said operations further comprise determining a slope of the fitted curve.

12. The apparatus of claim 10, wherein said operations further comprise determining a variance of a residual of the fitted curve.

13. The apparatus of claim 10, wherein said operations further comprise identifying a plurality of periods in the repeating pattern and associating the acquired samples with a phase in one of the identified periods.

14. The apparatus of claim 13, wherein said operations further comprise interleaving the associated samples with each of the identified periods.

15. The apparatus of claim 13, further comprising a trigger module to receive a synchronization signal generated synchronously with the signal received in the channel, said trigger module providing timing information to identify the plurality of periods.

16. The apparatus of claim 1, wherein the signal received in the channel comprises a data signal.

17. The apparatus of claim 1, wherein the signal received in the channel comprises a clock signal.

18. The apparatus of claim 1, further comprising a display device for displaying a representation of the determined at least one horizontal component of said jitter and the isolated at least one vertical component of said jitter.

19. A method of measuring jitter with an oscilloscope, the method comprising:
  receiving on a channel of a digital oscilloscope a non-return-to-zero digital signal having a repeating pattern that includes a sequence of transitions, said signal having jitter;
  acquiring a plurality of digital samples of the signal over a plurality of occurrences of said repeating pattern; and
  processing the digital samples to resolve the jitter into a plurality of components, said processing comprising:
    i) determining at least one horizontal component that corresponds to a time domain error of said jitter;
    ii) isolating at least one vertical component that corresponds to an amplitude error of said jitter from said horizontal component;
    iii) determining a total signal jitter;
    iv) identifying an amount of intrinsic jitter added by the channel; and
    v) determining a signal jitter by quadrature subtraction of the intrinsic jitter from a measured total jitter.

20. The method of claim 19, further comprising fitting a curve to the acquired samples.

21. The method of claim 20, further comprising determining a slope of the fitted curve.

22. The method of claim 20, further comprising determining a variance of a residual of the fitted curve.

23. The method of claim 19, further comprising generating an eye diagram from the sampled patterns.

24. The method of claim 23, wherein generating the eye diagram comprises synchronizing and overlaying the periods.

25. The method of claim 19, further comprising generating a probability distribution function upon processing the digital samples.

26. The method of claim 19, further comprising generating a bathtub curve from the sampled patterns.

27. The method of claim 19, further comprising determining a deterministic jitter.

28. The method of claim 27, wherein the determined deterministic jitter is associated with the jitter on the received signal.

29. The apparatus of claim 19, wherein said operations further comprise determining a random jitter.

30. The method of claim 29, wherein the determined random jitter is associated with the jitter on the received signal.

31. The method of claim 19, wherein said processing further comprises determining at least one component of the horizontal component that comprises horizontal jitter introduced by the digital oscilloscope.

32. The method of claim 19, wherein said processing further comprises determining at least one component of the vertical component that comprises vertical jitter present in the received periodic signal.

33. The method of claim 19, further comprising identifying a bit error rate specification and determining the variance associated with the specified bit error rate.

34. The method of claim 19, further comprising acquiring the waveform using coherent interleaved sampling.

35. The method of claim 19, further comprising triggering the samples based on a clock signal synchronized to the received waveform.

36. The method of claim 19, further comprising post-processing the received waveform to identify periods.

37. The method of claim 19, wherein the processing is performed without receiving information extrinsic to the received signal itself about the frequency of the received signal.

38. The method of claim 19, wherein the processing is performed without receiving information extrinsic to the received signal itself about the pattern of the received signal.

39. The method of claim 19, wherein the processing is performed without receiving information extrinsic to the received signal itself about the coding of the received signal.

40. The method of claim 19, wherein the processing is performed without receiving information extrinsic to the received signal itself about the encryption of the received signal.

* * * * *